United States Patent
Kumagai et al.

(10) Patent No.: US 9,269,672 B2
(45) Date of Patent: Feb. 23, 2016

(54) SEMICONDUCTOR INTEGRATED DEVICE FOR DISPLAY DRIVE

(71) Applicant: Synaptics Display Devices GK, Tokyo (JP)

(72) Inventors: Yasuhiro Kumagai, Tokyo (JP); Masami Koketsu, Tokyo (JP)

(73) Assignee: Synaptics Display Devices GK, Tokyo (JP)

( * ) Notice: Subject to any disclaimer, the term of this patent is extended or adjusted under 35 U.S.C. 154(b) by 0 days.

(21) Appl. No.: 14/491,995

(22) Filed: Sep. 20, 2014

(65) Prior Publication Data

US 2015/0108611 A1    Apr. 23, 2015

(30) Foreign Application Priority Data

Oct. 17, 2013 (JP) ................. 2013-215982

(51) Int. Cl.
*H01L 23/544* (2006.01)
*H01L 23/522* (2006.01)

(52) U.S. Cl.
CPC .......... *H01L 23/544* (2013.01); *H01L 23/5226* (2013.01); *H01L 2223/5442* (2013.01); *H01L 2223/54406* (2013.01); *H01L 2223/54426* (2013.01); *H01L 2223/54433* (2013.01); *H01L 2223/54473* (2013.01); *H01L 2924/0002* (2013.01)

(58) Field of Classification Search
CPC ............ H01L 23/544; H01L 23/49811; H01L 23/5226; H01L 21/782
USPC ........................................ 257/620
See application file for complete search history.

(56) References Cited

U.S. PATENT DOCUMENTS

| | | | | |
|---|---|---|---|---|
| 5,640,049 | A * | 6/1997 | Rostoker et al. | 257/758 |
| 7,825,529 | B2 * | 11/2010 | Horii | 257/797 |
| 8,008,788 | B2 * | 8/2011 | Koketsu et al. | 257/797 |
| 8,421,250 | B2 | 4/2013 | Koketsu et al. | |
| 9,036,105 | B2 * | 5/2015 | Oh et al. | 349/43 |
| 2012/0086845 | A1 * | 4/2012 | Enomoto et al. | 348/311 |
| 2013/0009268 | A1 * | 1/2013 | Testa et al. | 257/443 |
| 2013/0077034 | A1 * | 3/2013 | Jung et al. | 349/122 |
| 2013/0321680 | A1 * | 12/2013 | Kumano | 348/273 |

FOREIGN PATENT DOCUMENTS

JP    2009-194119 A    8/2009

* cited by examiner

*Primary Examiner* — Nathan Ha
(74) *Attorney, Agent, or Firm* — Miles & Stockbridge P.C.; Eric G. King

(57) ABSTRACT

In a display drive IC chip of an LCD or the like, an alignment mark is arranged in an alignment mark arrangement region on the main surface thereof, a dummy pattern is arranged on a lower layer, and an actual pattern is further arranged on the lower layer.

20 Claims, 21 Drawing Sheets

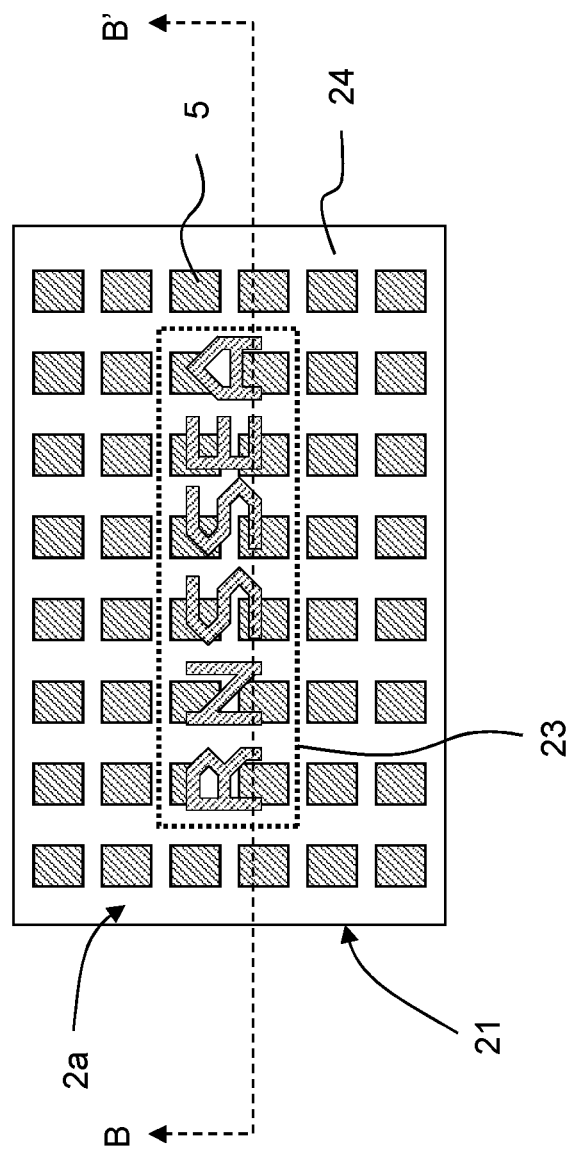

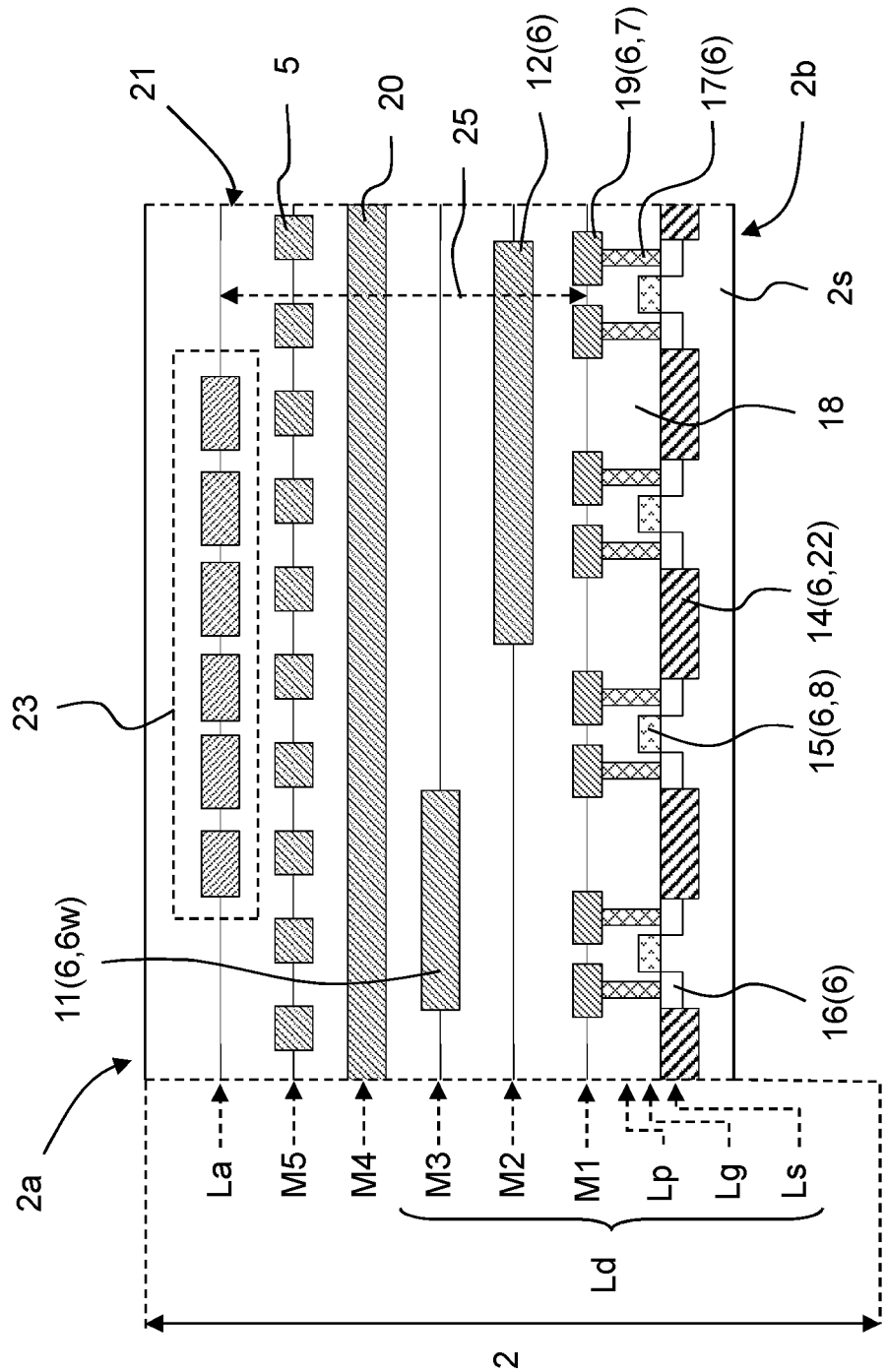

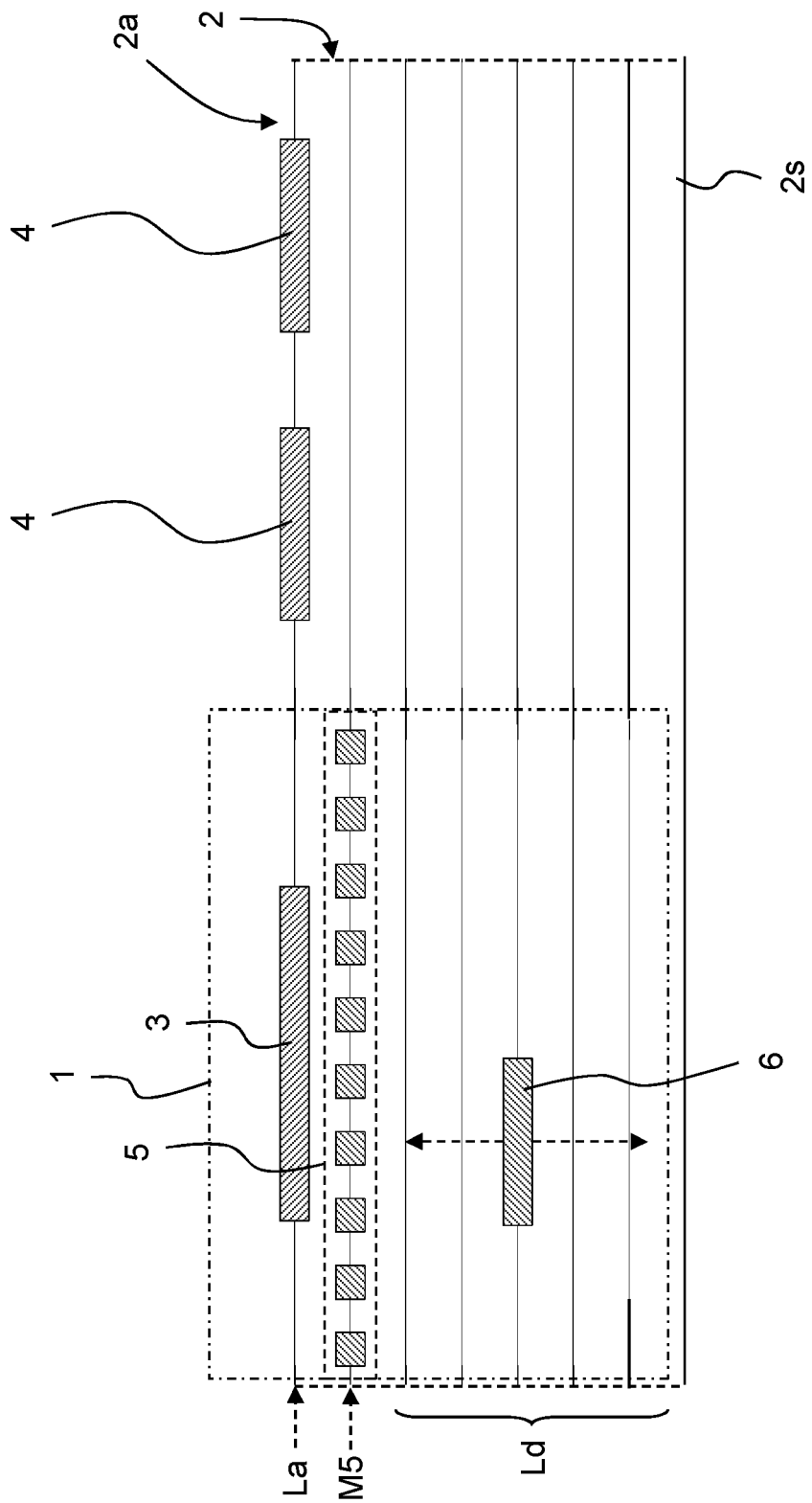

SEMICONDUCTOR INTEGRATED DEVICE FOR DISPLAY DRIVE

CROSS-REFERENCE TO RELATED APPLICATIONS

The Present application claims priority from Japanese application JP 2013-215982 filed on Oct. 17, 2013, the content of which is hereby incorporated by reference into this application.

BACKGROUND

The application relates to a semiconductor integrated device (or semiconductor device), and can be applied to, for example, a semiconductor integrated device for display drive.

JP-A-2009-194119 or U.S. Pat. No. 8,421,250 corresponding thereto relates to a semiconductor chip for an LCD (Liquid Crystal Display) driver. The above documents disclose a technique in which an alignment mark is formed in an alignment mark forming region by a metal wiring layer flush with a pad layer, and dummy patterns are respectively arranged in a wiring layer, a device layer, and an element isolation layer which are located below the region.

SUMMARY

For example, a driver IC (Integrated Circuit) chip for a liquid crystal device (LCD) such as a cellular phone is generally formed on a rectangular silicon substrate having a relatively long side. In order to mount the driver chip on a wiring film such as an FTCP (Flexible Tape Carrier Package), an ACF (Anisotropically Conductive Adhesive Film) is generally interposed between a wiring on the wiring film and a gold bump electrode on the driver chip. This is entirely the same as in mounting on an interconnect substrate or a glass substrate.

In this case, it is necessary to measure an alignment mark on the driver chip optically (for example, using visible broadband light), recognize the position thereof in an XY direction, perform alignment with a high degree of accuracy, and attach the alignment mark to the ACF on the wiring film.

Consequently, in order to secure the visibility of the alignment mark, generally, each layer of an alignment mark arrangement region for arranging the alignment mark is not provided with an actual pattern (a normal device and circuit pattern irrelevant to the alignment mark, the dummy pattern or the like), but is instead provided with the dummy pattern.

However, the inventor has found as a result of examining these methods that in such methods, there is a concern that the flexibility at the time of performing the layout of a circuit module or the like on the driver chip may be significantly reduced.

Although means and the like for solving such problems will be described below, other problems and novel features will be made clearer from the description and the accompanying drawings of the present specification.

The following is a brief description of the summary of the representative embodiments of the invention disclosed in the application.

That is, the summary of an embodiment of the application is that in a display drive IC chip (such as an LCD driver) of an LCD or the like, an alignment mark is arranged in an alignment mark arrangement region on the main surface thereof, a dummy pattern is arranged on a lower layer, and an actual pattern is further arranged on the lower layer.

The following is a brief description of an effect obtained by the representative embodiments of the invention disclosed in the application.

That is, according to the embodiment of the application, it is possible to prevent a large decline of the flexibility of a circuit layout in an LCD driver or the like.

4 illustrating Modification Example 3 (omission of the pad layer dummy wiring pattern and a lower actual wiring pattern) relating to the entire device structure within the alignment mark arrangement region.

Figure 4:
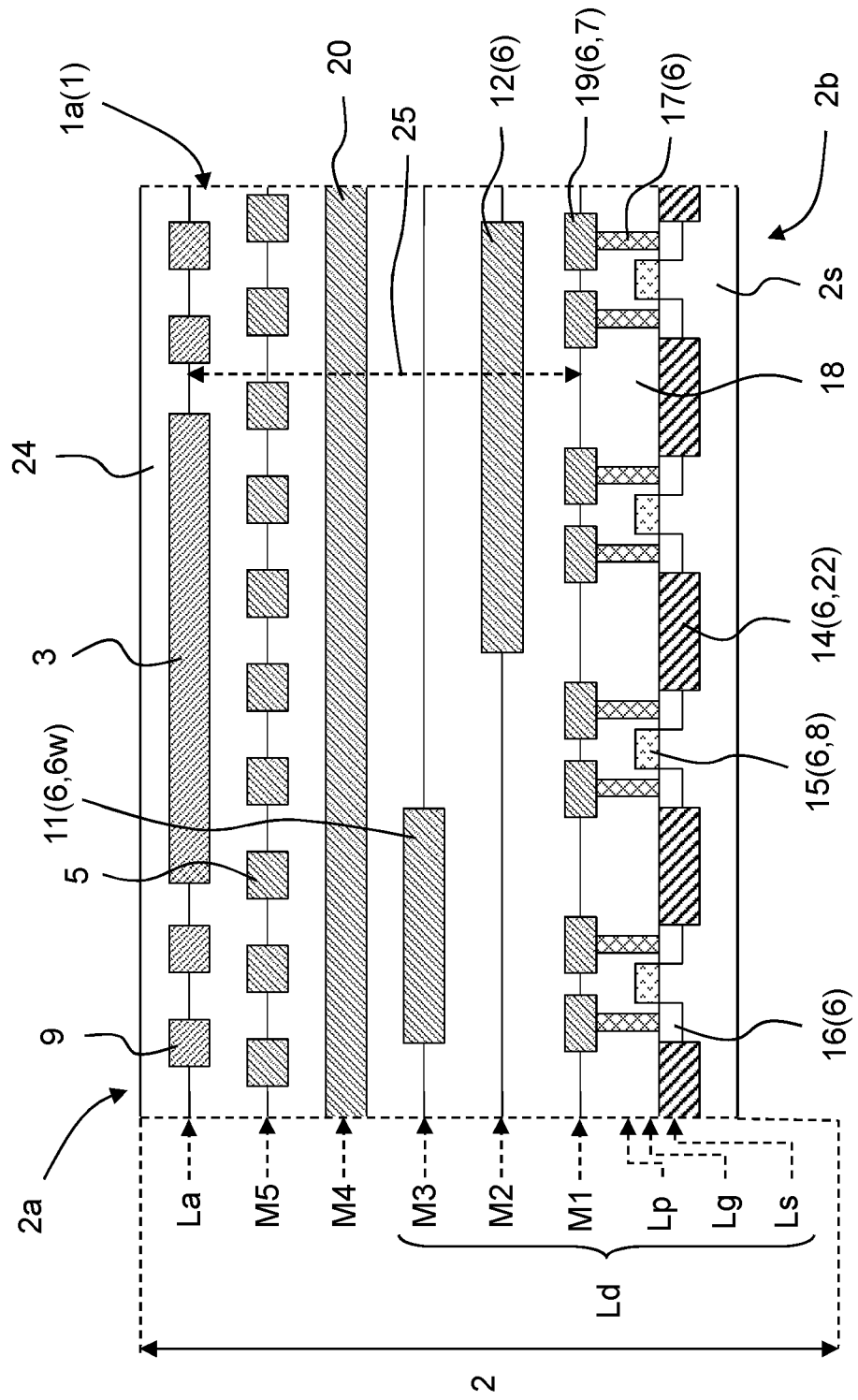
FIG. 4 is an enlarged cross-sectional view illustrating an alignment mark arrangement region 1a (1) of FIG. 3.
Figure 14:
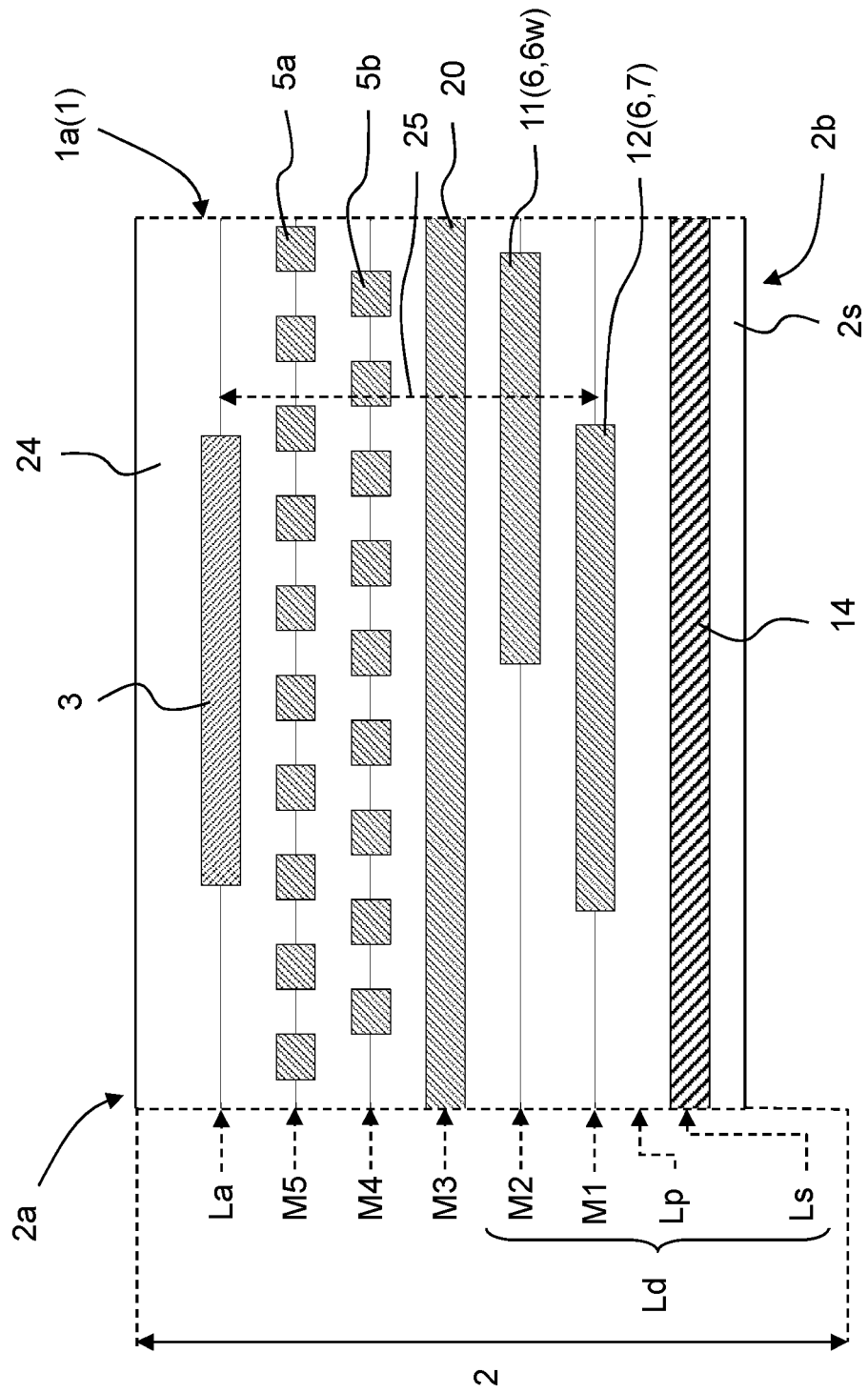

FIG. 14 is an enlarged cross-sectional view of the alignment mark arrangement region 1a (1) corresponding to FIG. 4 illustrating Modification Example 4 (omission of the pad layer dummy wiring pattern and introduction of an upper two-layer dummy pattern) relating to the entire device structure within the alignment mark arrangement region.

Figure 15:
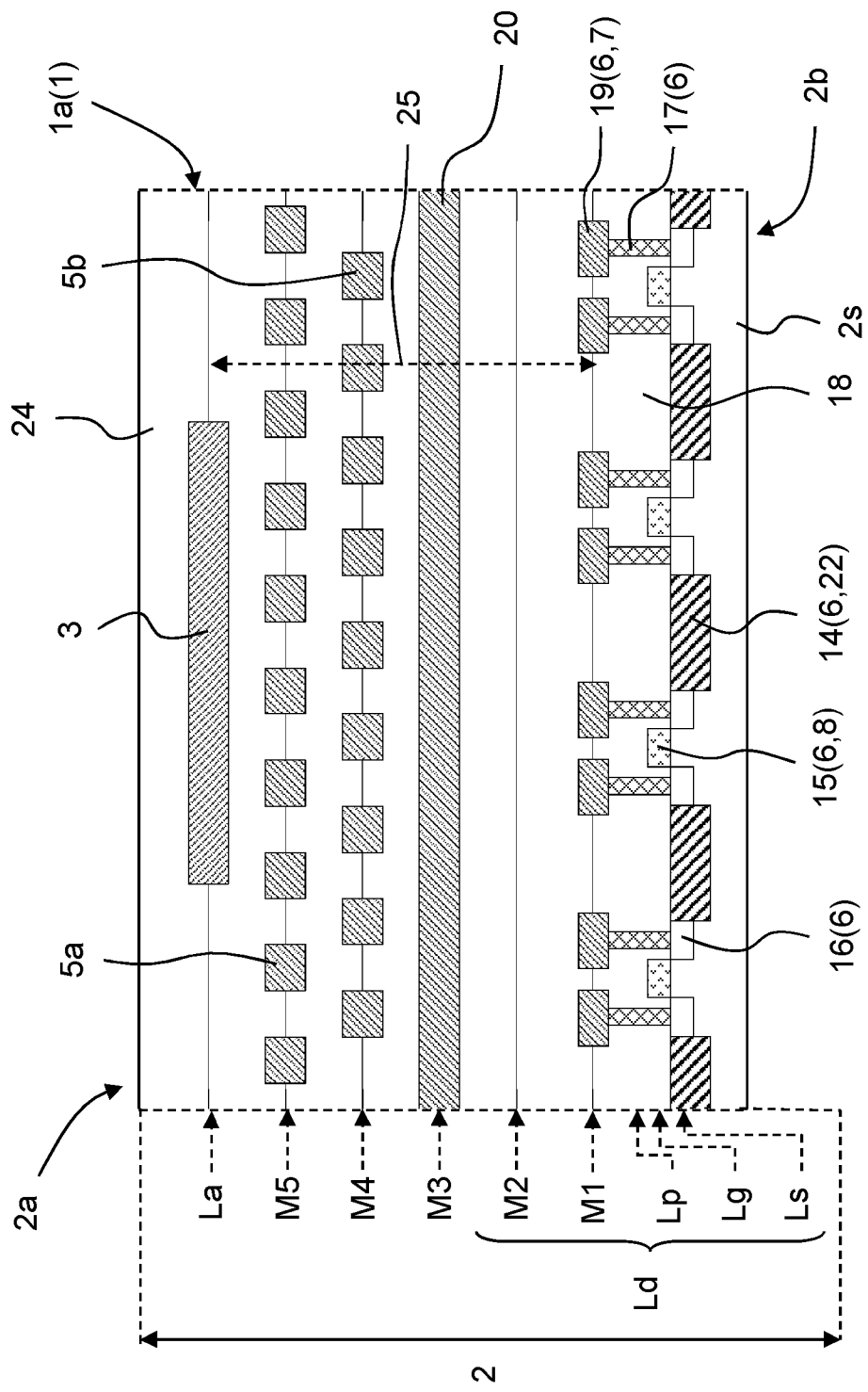

FIG. 15 is an enlarged cross-sectional view of the alignment mark arrangement region 1a (1) corresponding to FIG. 4 illustrating Modification Example 5 (omission of the pad layer dummy wiring pattern and the lower actual wiring pattern and introduction of the upper two-layer dummy pattern) relating to the entire device structure within the alignment mark arrangement region.

Figure 16:
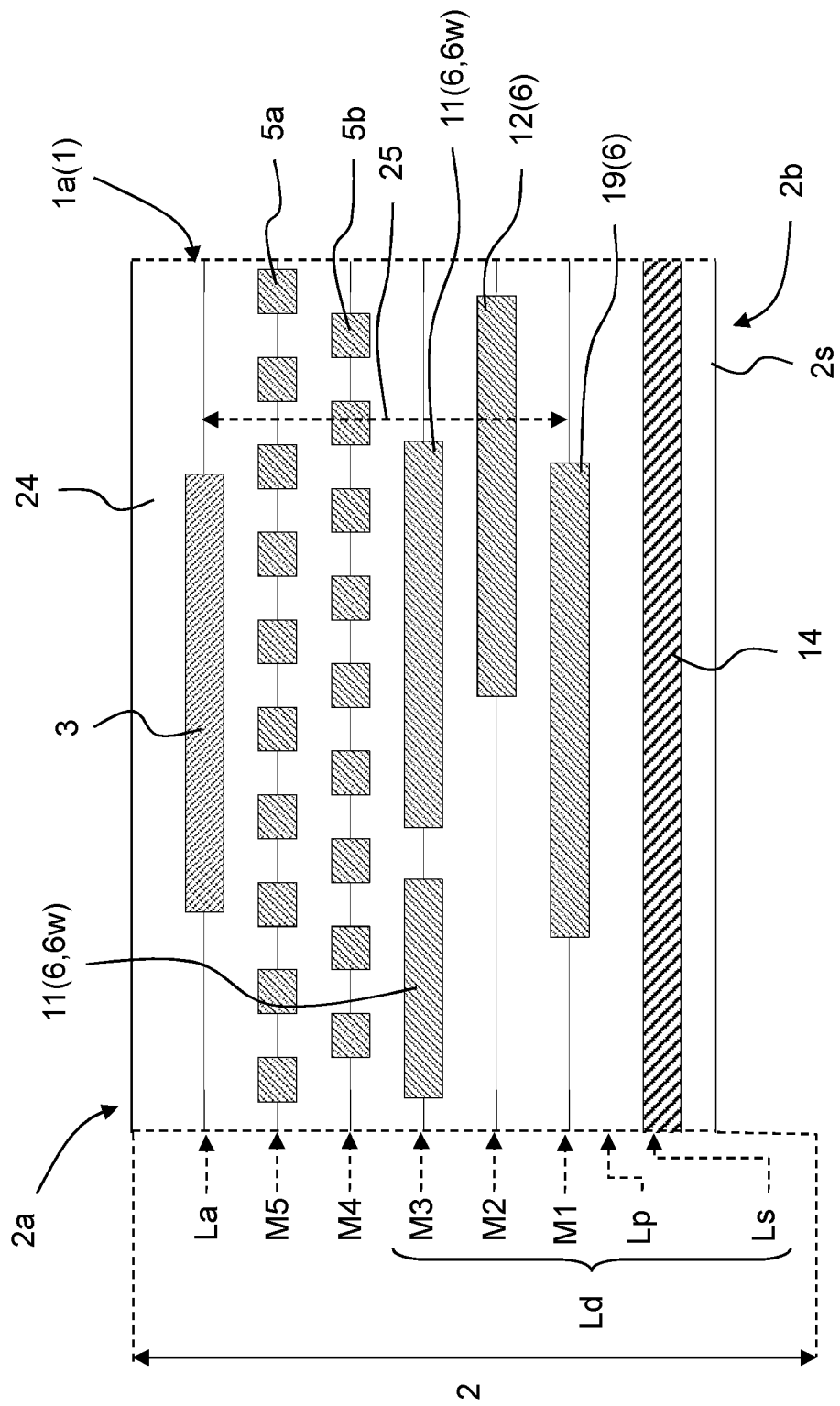

FIG. 16 is an enlarged cross-sectional view of the alignment mark arrangement region 1a (1) corresponding to FIG. 4 illustrating Modification Example 6 (omission of the pad layer dummy wiring pattern and the light shielding pattern, and introduction of the upper two-layer dummy pattern and the flat STI) relating to the entire device structure within the alignment mark arrangement region.

Figure 17:
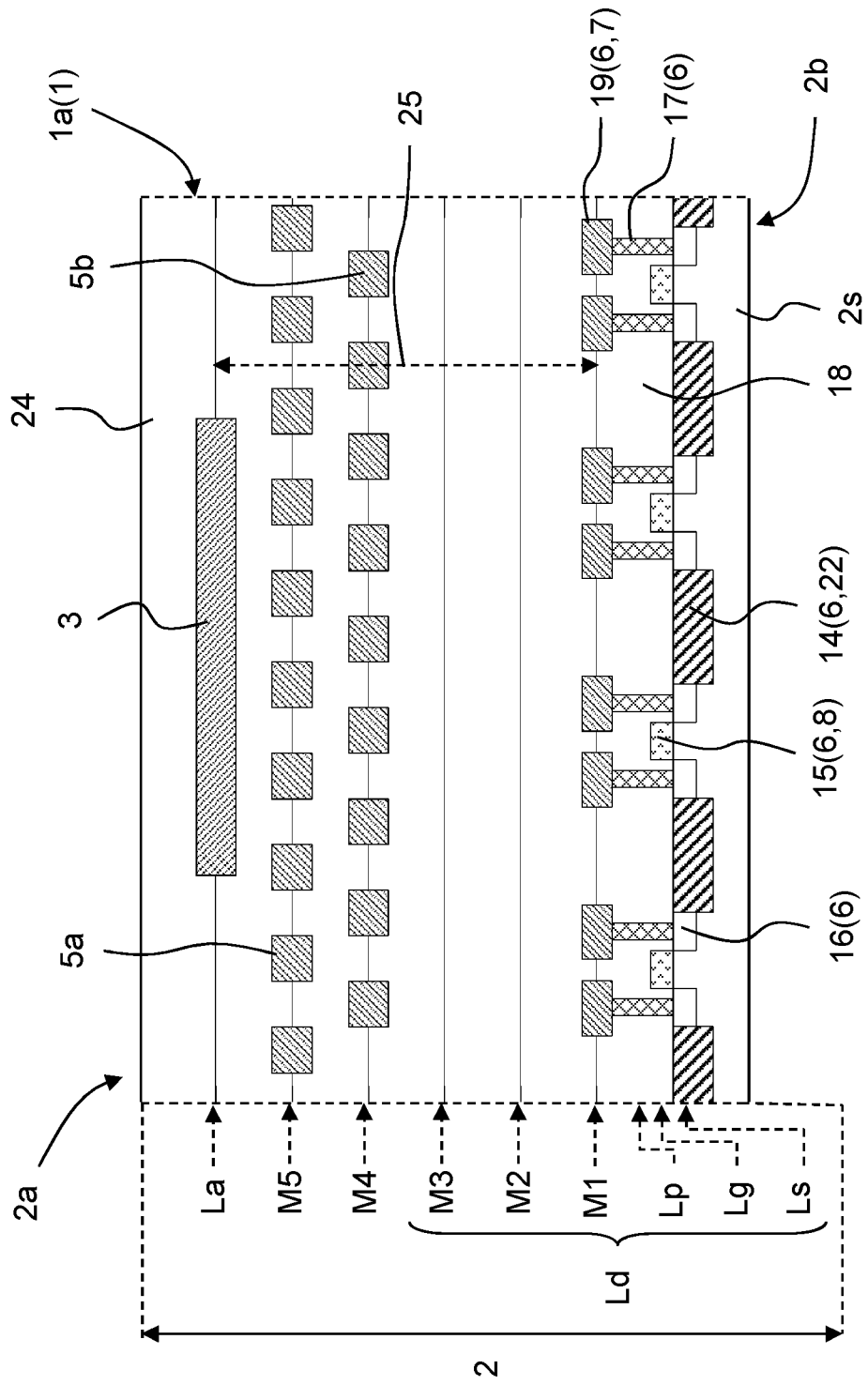

FIG. 17 is an enlarged cross-sectional view of the alignment mark arrangement region 1a (1) corresponding to FIG. 4 illustrating Modification Example 7 (omission of the pad layer dummy wiring pattern and the light shielding pattern, and introduction of the upper two-layer dummy pattern) relating to the entire device structure within the alignment mark arrangement region.

Figure 1:
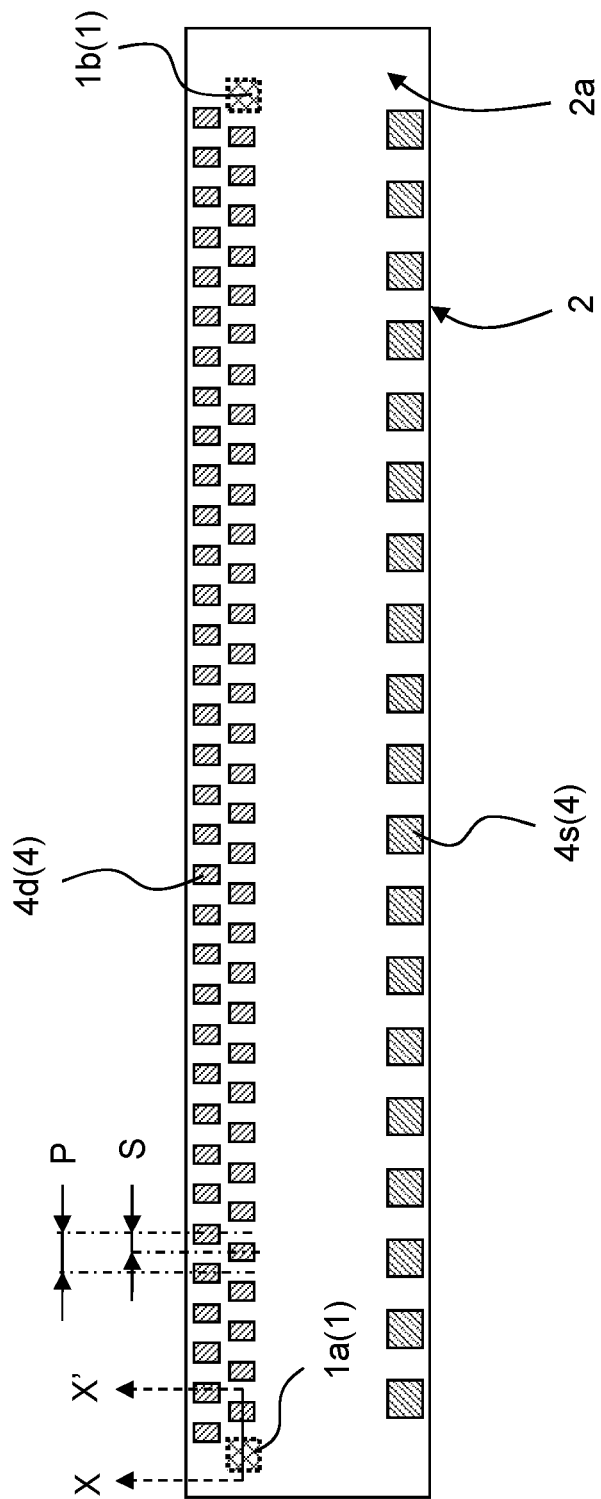
FIG. 1 is a layout diagram of the entire chip surface illustrating an outline of a layout of an LCD driver chip which is an example of a semiconductor integrated device for display drive according to an embodiment of the application.
Figure 18:
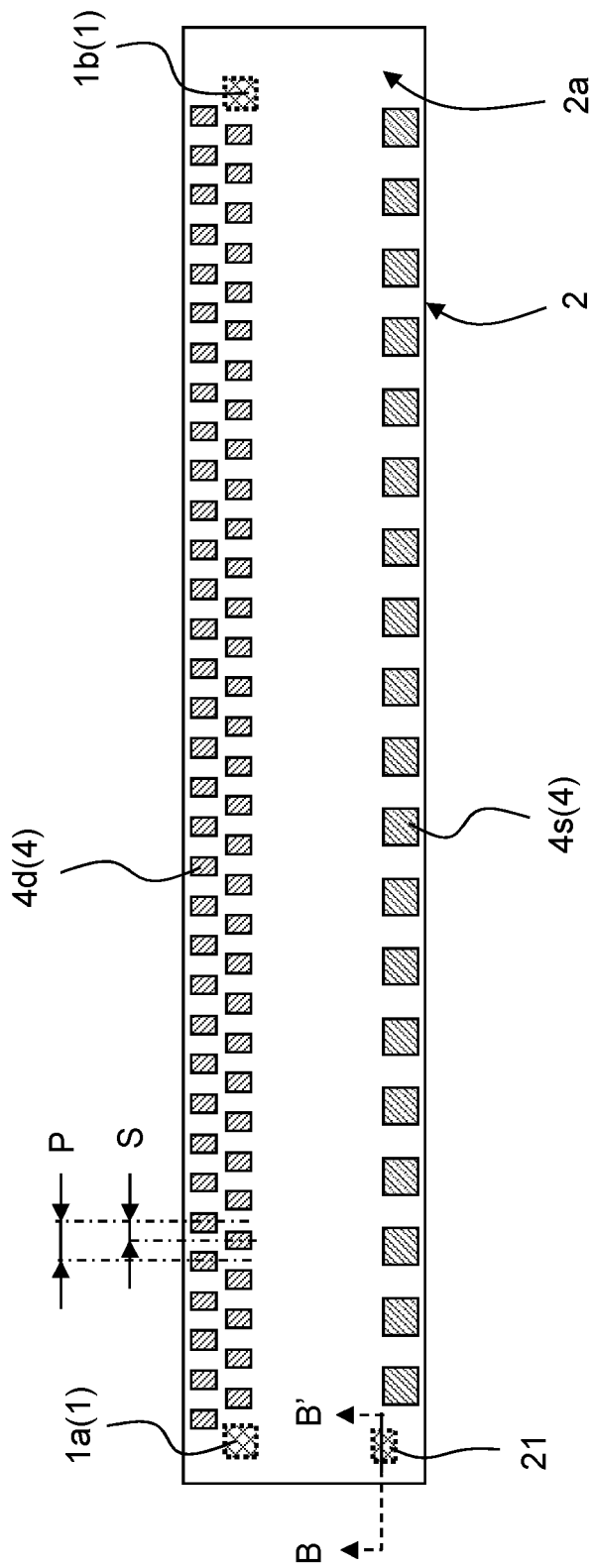

FIG. 18 is a layout diagram of the entire chip surface corresponding to FIG. 1 illustrating Modification Example 8 relating to the entire device structure within an identification pattern arrangement region.

FIG. 19 is a top view (mainly showing the pad metal wiring layer La and the upper metal wiring layer M5) of an identification pattern arrangement region 21 of FIG. 18.

FIG. 20 is an enlarged cross-sectional view of the identification pattern arrangement region 21 of cross-section B-B' of FIG. 18 corresponding to FIG. 4.

Figure 3:
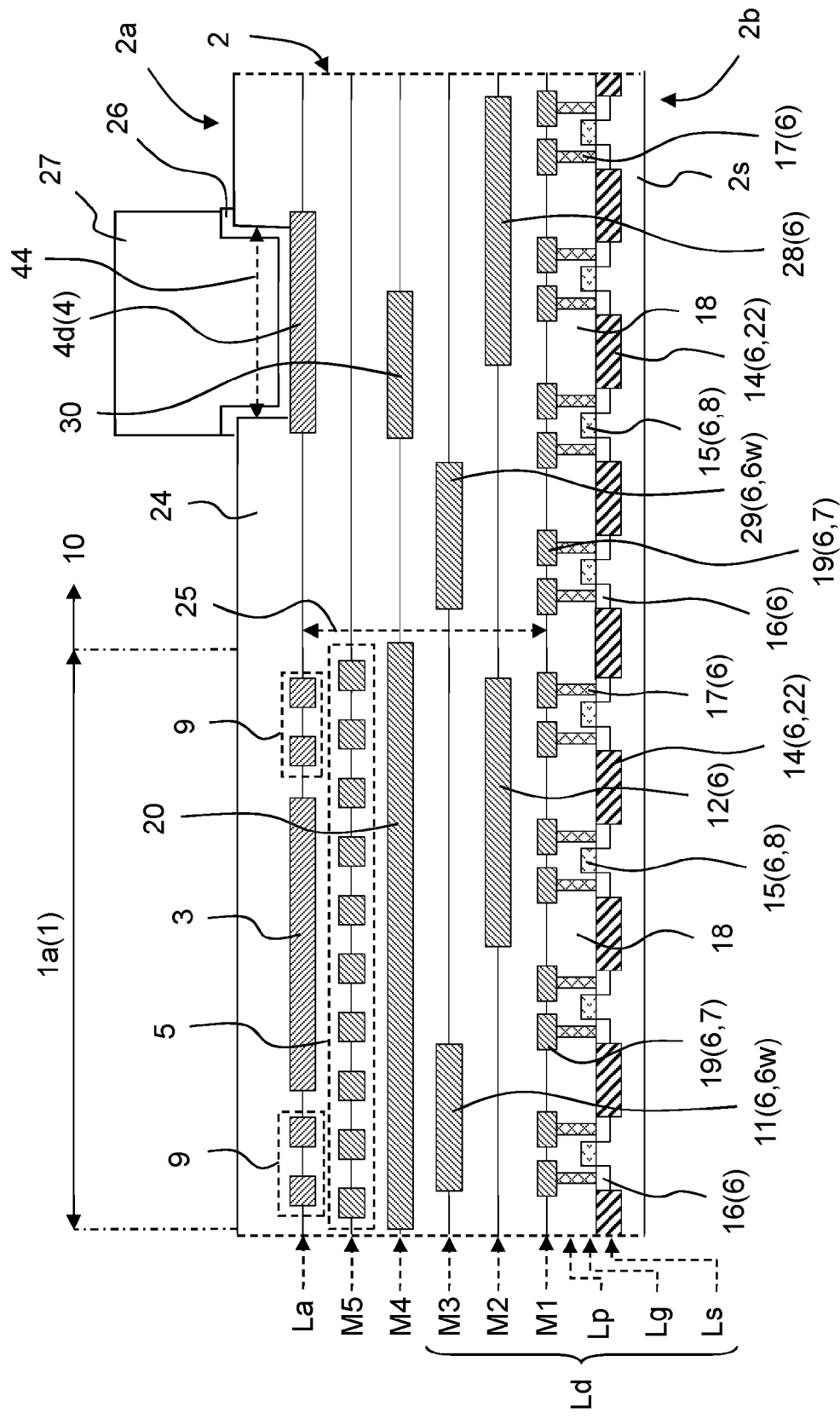
FIG. 3 is a cross-sectional view of a chip corresponding to cross-section X-X' of FIG. 1 illustrating the details of a device structure of the LCD driver chip which is an example of the semiconductor integrated device for display drive according to the embodiment of the application.

FIG. 21 is a schematic cross-sectional view of a chip corresponding to cross-section X-X' of FIG. 1 corresponding to FIG. 3 illustrating the outline of the device structure of the LCD driver chip which is an example of the semiconductor integrated device for display drive according to the embodiment of the application.

DETAILED DESCRIPTION (Summary of the Embodiments)

First, summary of representative embodiments of the invention disclosed in the application will be described.

(1) A semiconductor integrated device for display drive including:

(a) a chip-shaped semiconductor substrate having a first main surface;

(b) a large number of pad electrodes for bump electrode formation, provided on the first main surface side of the chip-shaped semiconductor substrate, which are constituted by a pad metal wiring layer;

(c) an alignment mark arrangement region provided on the first main surface side of the chip-shaped semiconductor substrate;

(d) an alignment mark, provided on the first main surface side of the chip-shaped semiconductor substrate and within the alignment mark arrangement region, which is constituted by the pad metal wiring layer;

(e) an upper dummy wiring pattern, provided on the first main surface side of the chip-shaped semiconductor substrate and within the alignment mark arrangement region, which is constituted by an upper metal wiring layer located below the pad metal wiring layer; and (f) an actual device pattern, provided on the first main surface side of the chip-shaped semiconductor substrate and within the alignment mark arrangement region, which is constituted by a lower device layer located below the upper metal wiring layer.

(2) The semiconductor integrated device for display drive according to the above (1), wherein the lower device layer is a first intermediate metal wiring layer, and the actual device pattern is an intermediate actual wiring pattern.

(3) The semiconductor integrated device for display drive according to the above (2), further including:

(g) a lower actual wiring pattern, provided on the first main surface side of the chip-shaped semiconductor substrate and within the alignment mark arrangement region, which is constituted by a lower metal wiring layer located below the first intermediate metal wiring layer.

(4) The semiconductor integrated device for display drive according to the above (2) or (3), further including:

(h) a light shielding pattern, provided on the first main surface side of the chip-shaped semiconductor substrate and within the alignment mark arrangement region, which is constituted by a second intermediate metal wiring layer located below the upper metal wiring layer and located above the first intermediate metal wiring layer.

(5) The semiconductor integrated device for display drive according to the above (4), wherein the light shielding pattern is a line-and-space pattern.

(6) The semiconductor integrated device for display drive according to any one of the above (2) to (5), wherein the intermediate actual wiring pattern is a power supply wiring pattern.

(7) The semiconductor integrated device for display drive according to any one of the above (4) to (6), wherein the upper metal wiring layer, the first intermediate metal wiring layer, the second intermediate metal wiring layer and the lower metal wiring layer are copper-based buried wirings, respectively.

(8) The semiconductor integrated device for display drive according to any one of the above (1) to (7), wherein the pad metal wiring layer is an aluminum-based non-buried wiring.

(9) The semiconductor integrated device for display drive according to any one of the above (1) to (8), further including:

(i) a pad layer dummy wiring pattern, provided on the first main surface side of the chip-shaped semiconductor substrate and in the vicinity of the alignment mark within the alignment mark arrangement region, which is constituted by the pad metal wiring layer.

(10) The semiconductor integrated device for display drive according to any one of the above (3) to (9), further including:

(j) an actual gate electrode pattern, provided on the first main surface side of the chip-shaped semiconductor substrate and within the alignment mark arrangement region, which is constituted by a gate electrode layer located below the lower metal wiring layer; and (k) an actual element isolation insulating film pattern, provided on the first main surface side of the chip-shaped semiconductor substrate and within the alignment mark arrangement region, which is constituted by an element isolation insulating film layer located below the gate electrode layer.

(11) A semiconductor integrated device for display drive including:

(a) a chip-shaped semiconductor substrate having a first main surface;

(b) a large number of pad electrodes for bump electrode formation, provided on the first main surface side of the chip-shaped semiconductor substrate, which are constituted by a pad metal wiring layer;

(c) an identification pattern arrangement region provided on the first main surface side of the chip-shaped semiconductor substrate;

(d) an identification pattern, provided on the first main surface side of the chip-shaped semiconductor substrate and within the identification pattern arrangement region, which is constituted by the pad metal wiring layer;

(e) an upper dummy wiring pattern, provided on the first main surface side of the chip-shaped semiconductor substrate and within the identification pattern arrangement region, which is constituted by an upper metal wiring layer located below the pad metal wiring layer; and (f) an actual device pattern, provided on the first main surface side of the chip-shaped semiconductor substrate and within the identification pattern arrangement region, which is constituted by a lower device layer located below the upper metal wiring layer.

(12) The semiconductor integrated device for display drive according to the above (11), wherein the lower device layer is a first intermediate metal wiring layer, and the actual device pattern is an intermediate actual wiring pattern.

(13) The semiconductor integrated device for display drive according to the above (12), further including:

(g) a lower actual wiring pattern, provided on the first main surface side of the chip-shaped semiconductor substrate and within the identification pattern arrangement region, which is constituted by a lower metal wiring layer located below the first intermediate metal wiring layer.

(14) The semiconductor integrated device for display drive according to the above (12) or (13), further including:

(h) a light shielding pattern, provided on the first main surface side of the chip-shaped semiconductor substrate and within the identification pattern arrangement region, which is constituted by a second intermediate metal wiring layer located below the upper metal wiring layer and located above the first intermediate metal wiring layer.

(15) The semiconductor integrated device for display drive according to the above (14), wherein the light shielding pattern is a line-and-space pattern.

(16) The semiconductor integrated device for display drive according to any one of the above (12) to (15), wherein the intermediate actual wiring pattern is a power supply wiring pattern.

(17) The semiconductor integrated device for display drive according to any one of the above (14) to (16), wherein the upper metal wiring layer, the first intermediate metal wiring layer, the second intermediate metal wiring layer and the lower metal wiring layer are copper-based buried wirings, respectively.

(18) The semiconductor integrated device for display drive according to any one of the above (11) to (17), wherein the pad metal wiring layer is an aluminum-based non-buried wiring.

(19) The semiconductor integrated device for display drive according to any one of the above (11) to (18), further including:

(i) a pad layer dummy wiring pattern, provided on the first main surface side of the chip-shaped semiconductor substrate and in the vicinity of the identification pattern within the identification pattern arrangement region, which is constituted by the pad metal wiring layer.

(20) The semiconductor integrated device for display drive according to any one of the above (13) to (19), further including:

(j) an actual gate electrode pattern, provided on the first main surface side of the chip-shaped semiconductor substrate and within the identification pattern arrangement region, which is constituted by a gate electrode layer located below the lower metal wiring layer; and (k) an actual element isolation insulating film pattern, provided on the first main surface side of the chip-shaped semiconductor substrate and within the identification pattern arrangement region, which is constituted by an element isolation insulating film layer located below the gate electrode layer.

[Explanation of Description Form, Basic Terminology, and use Thereof in the Application]

1. In the application, the description of an embodiment may be such that the embodiment is divided into a plurality of sections, if necessary, in the description thereof for the sake of convenience. However, they are by no means independent of or distinct from each other unless particularly explicitly described otherwise, and one of the individual parts of a single example is details, variations, and so forth of part or the whole of the others. In principle, the repetition of like portions will be omitted. Each component in the embodiment is not indispensable unless particularly explicitly described otherwise, unless the component is theoretically limited to a specific number, and unless it is obvious from the context that the component is indispensable.

Further, in case that the term "semiconductor device" or "semiconductor integrated device" as used herein is mentioned in the application, the device principally refers to a semiconductor device or semiconductor integrated circuit in which, in addition to various single-element transistors (active elements) and various transistors which are main components, resistors, capacitors, and the like are integrated over a semiconductor chip or the like (such as, for example, a mono-crystalline silicon substrate). Here, as an exemplary representative of the various transistors, there can be illustrated a metal insulator semiconductor field effect transistor (MISFET) represented by a metal oxide semiconductor field effect transistor (MOSFET). At this time, as an exemplary representative of an integrated circuit structure, there can be illustrated a complementary metal insulator semiconductor (CMIS) integrated circuit represented by a complementary metal oxide semiconductor (CMOS) integrated circuit which is a combination of an N-channel MISFET and a P-channel MISFET.

It is considered that a wafer process for a present-day semiconductor integrated device, that is, LSI (Large Scale Integration) is normally divided into two processes. That is, the first process is an FEOL (Front End of Line) process from the loading of a silicon wafer as a raw material to a premetal process (process including the formation of an interlayer insulating film or the like between the lower end of an M1 wiring layer and a gate electrode structure, the formation of a contact hole, tungsten plug, burial, and the like). The second process is a BEOL (Back End of Line) process starting from the formation of the M1 wiring layer, and ending at the formation of a pad opening in a final passivation film on an aluminum-based pad electrode (the above process is also included in a wafer level packaging process).

Meanwhile, in the application, for the sake of convenience, focusing on the layer of an interlayer insulating film, a wiring and a via belonging to the same interlayer insulating film are denoted by the same layer name. That is, the via between a first buried wiring and a second buried wiring is a second via.

2. Likewise, even in case that such wording as "X constituted by A" is used in association with a material, a composition, or the like in the description of the embodiment or the like, it does not exclude a material, a composition, or the like which contains an element other than A as one of the main components thereof unless particularly explicitly described otherwise, and unless it is obvious from the context that it excludes such a material, a composition, or the like. For example, in case that a component is mentioned, the wording means "X containing A as a main component" or the like. It goes without saying that, even in case that "silicon member" or the like is mentioned, it is not limited to pure silicon, and a member containing a SiGe alloy, another multi-element alloy containing silicon as a main component, another additive, or the like is also included.

Likewise, even in case that a "silicon oxide film", a "silicon oxide-based insulating film", or the like is mentioned, it includes not only a relatively pure undoped silicon oxide (Undoped Silicon Dioxide), but also an insulating film containing other silicon oxides as a main component. For example, an impurity-doped silicon oxide-based insulating film such as a TEOS-based silicon oxide, PSG (Phosphorus Silicate Glass), or BPSG (Borophosphosilicate Glass) is also a silicon oxide film. Further, in addition to a thermal oxide film and a CVD oxide film, a coated film such as SOG (Spin On Glass) or NSC (Nano-Clustering Silica) is also a silicon oxide film or a silicon oxide-based insulating film. Besides, a Low-k insulating film such as FSG (Fluorosilicate Glass), SiOC (Silicon Oxicarbide), a carbon-doped silicon oxide (Carbon-doped Silicon oxide), or OSG (Organosilicate Glass) is also a silicon oxide film or a silicon oxide-based insulating film. Further, a silica-based Low-k insulating film (porous insulating film, including a molecular porous medium in case that "porous" is mentioned) obtained by introducing voids into the same member as mentioned above is also a silicon oxide film or a silicon oxide-based insulating film.

In addition, as a silicon-based insulating film which is commonly used in a semiconductor field along with a silicon oxide-based insulating film, there is a silicon nitride-based insulating film. Materials belonging to this group include SiN, SiCN, SiNH, SiCNH, and the like. Here, in case that "silicon nitride" is mentioned, it includes both of SiN and SiNH unless particularly explicitly described otherwise. Likewise, in case that "SiCN" is mentioned, it includes both of SiCN and SiCNH unless particularly explicitly described otherwise.

Meanwhile, SiC has properties similar to those of SiN, but SiON, in most cases, should rather be categorized as a silicon oxide-based insulating film, while the compound is close to SiC, SiN or the like in case that it is used as an etching stop film.

A silicon nitride film is frequently used as an etching stop film, that is, a CESL (Contact Etch-Stop Layer) in an SAC (Self-Aligned Contact) technique, and is also used as a stress applying film in an SMT (Stress Memorization Technique).

3. When the term "wafer" as used herein is mentioned, it typically refers to a mono-crystalline silicon wafer on which a semiconductor device (the same is true of a semiconductor integrated circuit device or an electronic device) is formed, but it goes without saying that the "wafer" also includes a composite wafer of an insulating substrate and a semiconductor layer or the like, such as an epitaxial wafer, a SOI substrate, or an LCD glass substrate.

4. It goes without saying that, although a preferred example is illustrated in association with a graphical figure, a position, an attribute, or the like, the graphical figure, position, or attribute is not strictly limited thereto unless it is particularly explicitly described otherwise, and unless it is obvious from the context that the graphical figure, position, or attribute is strictly limited thereto. Therefore, for example, "square" includes substantially square, "orthogonal" includes substantially orthogonal, and "coincident" includes substantially coincident. The same is true of "parallel" and "right-angled". Therefore, for example, deviation of approximately 10 degrees from completely parallel belongs to parallel.

In addition, regarding a certain region, in case that "whole", "entire", "whole area", and the like are mentioned, such terms include "substantially whole", "substantially entire", "substantially whole area", and the like. Therefore, for example, more than 80% of a certain region can be referred to as "whole", "entire", and "whole area". The same is true of "entire circumference", "entire length", and the like.

Further, regarding an existing shape, in case that "rectangular" is mentioned, such a term includes "substantially rectangular". Therefore, for example, in case that the area of a portion different from a rectangular shape is less than approximately 20% of the entirety, such a shape can be termed rectangular. In this case, the same is true of "annular" or the like. In this instance, in case that an annular body is split, apart into which a spilt elemental part is inner-inserted or outer-inserted is a portion of the annular body.

In addition, regarding periodicity, "periodic" includes substantially periodic. In case that the deviation of a period is less than approximately 20%, for example, with respect to individual elements, the individual elements can be said to be "periodic". Further, in case that elements falling out of this range are, for example, less than approximately 20% of all the subject elements for the periodicity, they can be said to be "periodic" as a whole.

Meanwhile, the definitions of this section are general. In case that there are different definitions in the following individual descriptions, the parts herein have priority to the individual descriptions. However, unless parts which are not specified in the individual descriptions are explicitly contradicted, the definitions, regulations and the like of this section are effective.

5. Further, in case that a specific numerical value or numerical amount is mentioned, it may be either more or less than the specific numerical value unless particularly explicitly described otherwise, unless the numerical value is theoretically limited to such a number, and unless it is obvious from the context that the numerical value is limited to such a number.

6. In the application, in case that a "device pattern", a "dummy pattern" or the like is mentioned regarding an alignment mark arrangement region, an optically explicitly recognizable pattern is referred to, and a pattern constituted by only an impurity dope pattern, a fine defect distribution pattern or the like which cannot be explicitly recognized through normal optical position detection or the like is not included in the "pattern" as used herein. However, for example, like an input protection diode, an optically explicitly recognizable pattern constituted by an impurity dope pattern, an element isolation pattern, a wiring pattern or the like is not, of course, applied thereto. Meanwhile, a uniform film or the like (for example, uniform STI insulating film) over the substantially entire surface of the alignment mark arrangement region or the like is not a pattern except for a light shielding pattern or the like.

The same is entirely true of an "identification pattern" (constituted by company's name display letters, signs, or other patterns, constituted by product model name display letters, signs, or other patterns, and so forth).

In this connection, a "dummy wiring pattern" generally includes a pattern (for example, pattern constituted by a large number of square fine patterns, or the like) which may not be used in a case of an actual wiring pattern.

Further, in the application, an "actual device pattern" is assumed to refer to an element pattern contributing to a circuit configuration, except for a pattern (dummy pattern, light shielding pattern or the like) for securing the visibility of an alignment mark or the like.

In addition, in the application, "upper", "intermediate", "lower" and the like which are mentioned regarding a wiring layer are added, for the sake of convenience, in order to make a vertical relationship therebetween easier to understand instinctively (in order to assist the clarity of the claims or the like), and so-called "upper wiring", "intermediate wiring", and "lower wiring" do not have a direct relationship therebetween.

Further, in the application, in case that a "device layer" is mentioned, the device layer is assumed to refer to a "wiring layer", a "gate layer", an "element isolation layer", or the like unless particularly explicitly described otherwise, or unless it is obvious from the context or the like that the device layer refers to different layers other than those.

In addition, in the application, regarding an alignment mark or an identification pattern, an "alignment mark arrangement region" ("identification pattern arrangement region") refers to a portion or the like to which special consideration is given for the reason that there is a great influence on the recognition of a place and the surrounding vicinity having the alignment mark (identification pattern) in case that the alignment mark (identification pattern) is optically recognized.

(Further Detailed Description of the Embodiments)

A further detailed description of the embodiments will be given. In each of the drawings, the same or similar portions are designated by the same or similar reference numerals or signs, and a description thereof will not be repeated in principle.

In addition, in the accompanying drawings, hatching or the like may be omitted even in a cross section in case that hatching or the like results in complicated illustration or incase that the distinction between the section to be hatched and a vacant space is distinct. In this connection, even a two-dimensionally closed hole may have a background outline thereof omitted in case that it is obvious from the description or the like that the hole is two-dimensionally closed and so on. Further, even a portion other than a cross section may be hatched to clearly show that the hatched portion is not a vacant space.

Meanwhile, regarding the designation in a case of a choice between the two, in case that one side is called "first" or the like, and the other side is called "second" or the like, they are illustrated correspondingly according to a representative embodiment. For example, it goes without saying that even in a case of "first", this is not limited to the illustrated choice.

1. Description of Outline of Layout of LCD Driver Chip Which is an Example of Semiconductor Integrated Device for Display Drive According to Embodiment of the Application and, an Example of Mounting State (See Mainly FIGS. 1 and 2)

Hereinafter, regarding mounting, a detailed description will be given mainly by taking an example of COF (Chip on Flex), but it goes without saying that normal COG (Chip on Glass) may be used.

Further, hereinafter, a detailed description will be given by taking an example of a technology node relating to a semiconductor chip having a thickness of 55 micrometers, but it goes without saying that a product having a node which is finer than such a thickness may be used, and a product having a node which is not finer than this thickness may be used.

Figure 2:
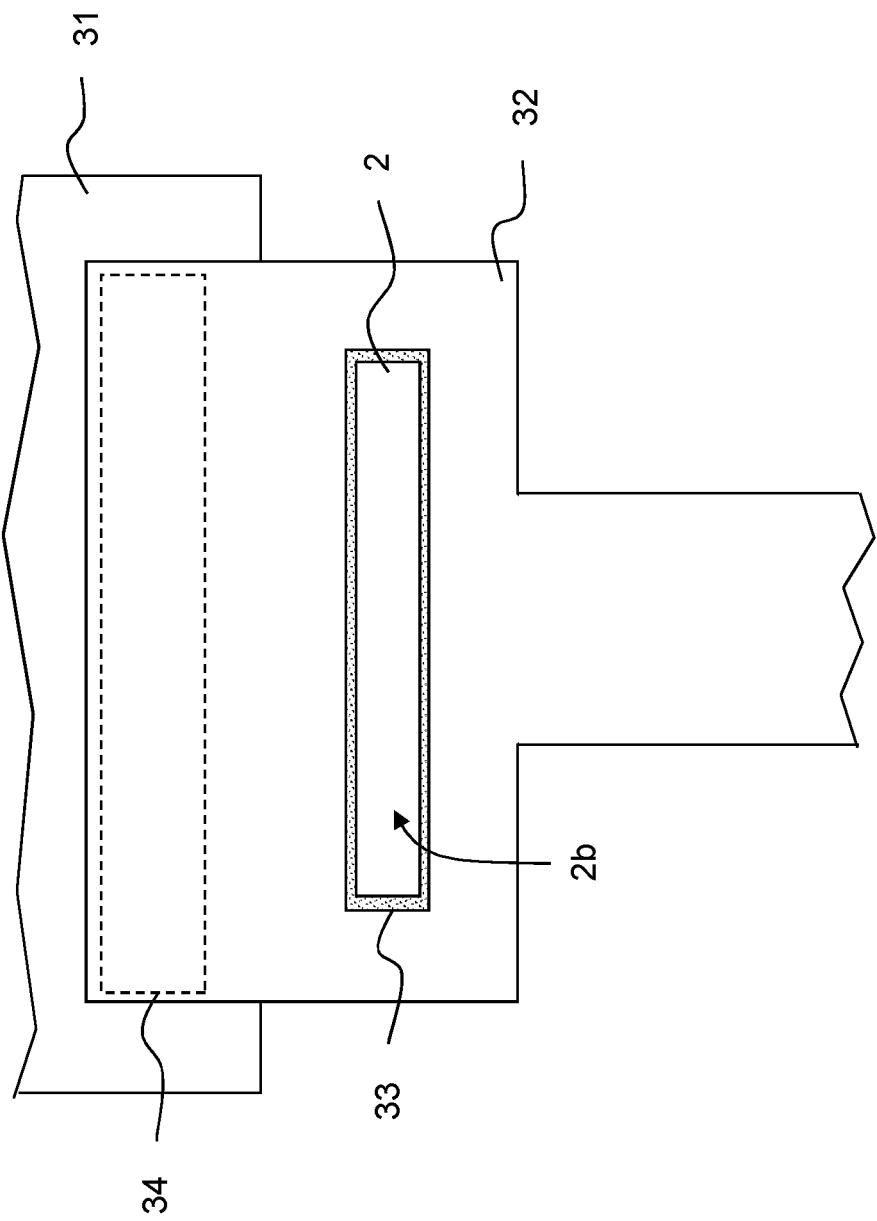
FIG. 2 is a partial top view of amounting film illustrating an example of a mounting state of the LCD driver chip which is an example of the semiconductor integrated device for display drive according to the embodiment of the application.

FIG. 1 is a layout diagram of the entire chip surface illustrating an outline of a layout of an LCD driver chip which is an example of a semiconductor integrated device for display drive according to an embodiment of the application. FIG. 2 is a partial top view of a mounting film illustrating an example of a mounting state of the layout of the LCD driver chip which is an example of the semiconductor integrated device for display drive according to the embodiment of the application. The outline of the layout of the LCD driver chip which is an example of the semiconductor integrated device for display drive according to the embodiment of the application, and an example of a mounting state will described with reference to the drawings.

First, FIG. 1 shows an outline of a layout of an LCD driver chip 2. As shown in FIG. 1, a large number of pad electrodes 4 for bump electrode formation (for example, aluminum-based metal pad electrodes) are provided on a surface 2a (first main surface) side of the semiconductor chip 2 (silicon single crystal chip). Generally, input pad electrodes 4s for bump electrode formation located in the pad electrode 4 for bump electrode formation have a relatively wide pitch, and output pad electrodes 4d for bump electrode formation located therein have a relatively narrow pitch. In addition, the output pad electrodes 4d for bump electrode formation are arrayed in multiple rows (for example, two rows to three rows) in many cases, and thus the alignment thereof is particularly important.

Further, alignment mark arrangement regions 1 (1a and 1b) are provided on the surface 2a side of the semiconductor chip 2, for example, in the vicinities of both ends thereof (may not be, of course, provided in the vicinities both ends thereof) (the number may be one or three or more without being limited to two; however, plural number allows rotation to be observed). This is because each of the alignment mark arrangement regions 1a and 1b is irradiated with reference light, an image of an alignment mark 3 or the like is acquired, and the two-dimensional position of the chip 2, rotation in two dimensions, as necessary, or the like is detected, to thereby perform alignment during the mounting thereof.

Here, in order to understand the device specifically, the dimensions of representative main portions are illustrated as follows (it is natural that there is no limitation to these dimensions). That is, the dimensions of the chip are, for example, approximately 1.5 millimeters long by approximately 32 millimeters wide. The dimensions of the input pad electrodes 4s for bump electrode formation (the same is substantially true of the dimensions of the input bump electrodes) are, for example, approximately 50 micrometers wide by approximately 100 micrometers long, and approximately 68 micrometers in pitch. On the other hand, the dimensions of the output pad electrodes 4d for bump electrode formation (the same is substantially true of the dimensions of the output bump electrodes) are, for example, approximately 18 micrometers wide by approximately 180 micrometers long, approximately 36 micrometers in pitch P, and approximately 12 micrometers in shift amount S between the upper and lower rows. In addition, the dimensions of each of the alignment mark arrangement regions 1a and 1b (1) are, for example, approximately 150 micrometers in length and width.

Next, FIG. 2 shows an example of mounting (cellular phone or the like). As shown in FIG. 2, the LCD driver chip 2 is attached onto a flexible wiring film 32 such as a polyimide film through an ACF (33) for a driver chip with the back side 2b directed upward. A large number of wirings (connection terminals) are arranged on the upper surface of the flexible wiring film 32 located below the ACF (33) for a driver chip, and are electrically connected to corresponding pad electrodes for bump electrode formation (more accurately, bump electrodes) located on the chip 2 through the ACF (33) for a driver chip. These wirings are led to the upper end of the flexible wiring film 32, are electrically connected to a large number of wirings (connection terminals) on the back side of the flexible wiring film 32, and are electrically connected to an ITO wiring or the like located on a glass substrate 31 of an LCD through an ACF (34) for an LCD.

2. Detailed Description of Device Structure of LCD Driver Chip Which is an Example of Semiconductor Integrated Device For Display Drive According to Embodiment of the Application (See Mainly FIGS. 3 to 6)

Here, a detailed description will be given by taking an example of an intermediate or lower metal wiring layer as an actual device pattern of a power supply wiring (ground wiring, or local interconnection wiring) such as a power supply trunk wiring or the like in the alignment mark arrangement region, but the actual device pattern may be a gate electrode pattern, an element isolation insulating film pattern, a tungsten plug pattern, and the like in addition thereto.

In the following example, various types of component structures for enhancing the visibility of an upper dummy wiring pattern, a pad layer dummy wiring pattern, a light shielding pattern, and the like will be described, but it goes without saying that each of these component structures is not indispensable. These respective component structures can be used, as necessary, in an appropriate combination.

Figure 5:
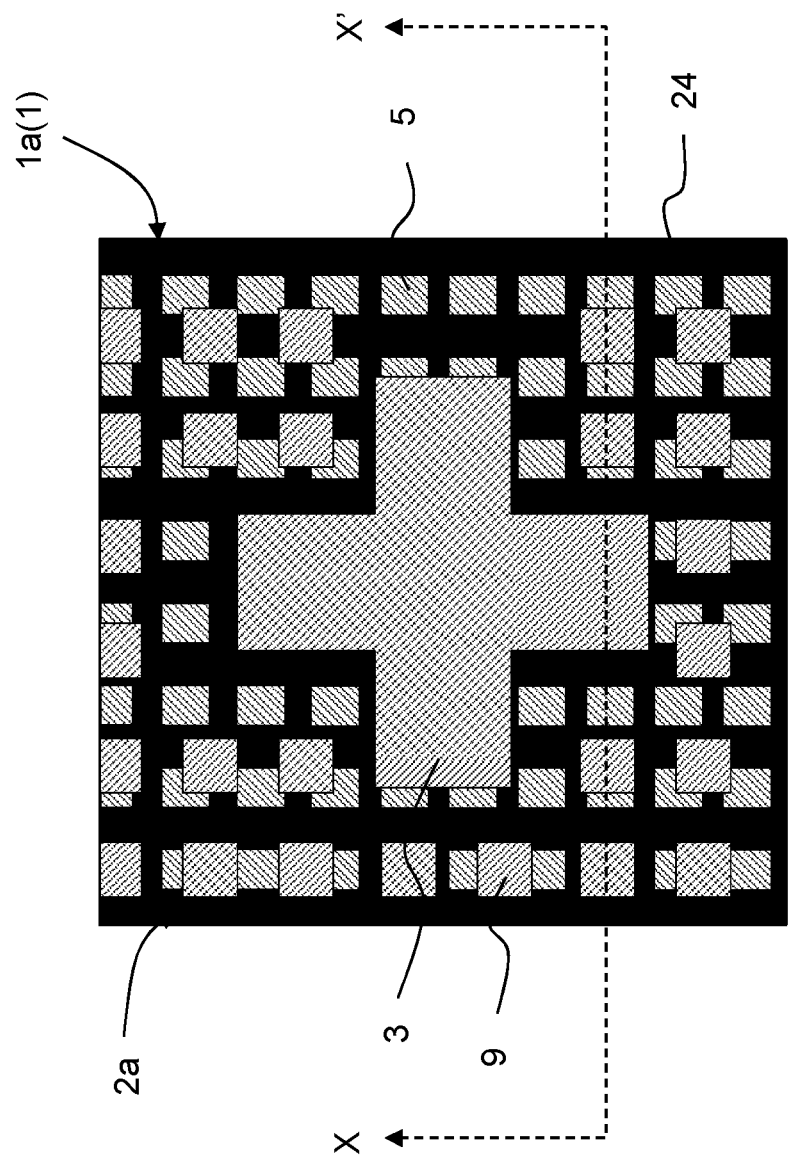
FIG. 5 is a top view of FIG. 4 (mainly showing a pad metal wiring layer La and an upper metal wiring layer M5).
Figure 6:
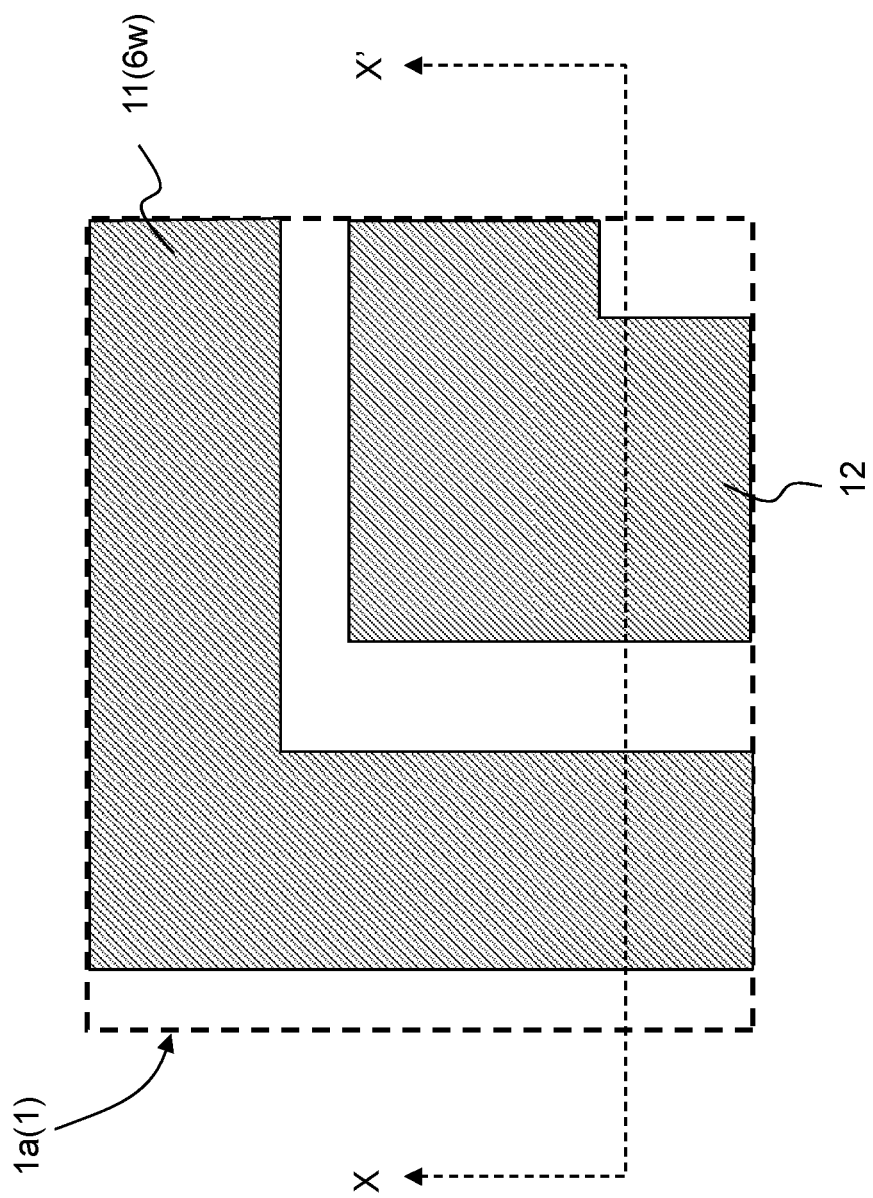
FIG. 6 is a planar layout diagram of FIG. 4 illustrating a power supply wiring pattern 11 (first intermediate metal wiring layer, that is, third copper-based metal buried wiring layer M3) and a ground wiring pattern 12 (second copper-based metal buried wiring layer M2) of FIG. 4.

FIG. 3 is a cross-sectional view of a chip corresponding to cross-section X-X' of FIG. 1 illustrating the details of a device structure of the LCD driver chip which is an example of the semiconductor integrated device for display drive according to the embodiment of the application (here and hereinafter, for convenience for illustration, the illustration of a gate insulating film, a well structure and the like will be omitted). FIG. 4 is an enlarged cross-sectional view illustrating an alignment mark arrangement region 1a (1) of FIG. 3. FIG. 5 is a top view of FIG. 4 (mainly showing a pad metal wiring layer La and an upper metal wiring layer M5). FIG. 6 is a planar layout diagram of FIG. 4 illustrating a power supply wiring pattern 11 (first intermediate metal wiring layer, that is, third copper-based metal buried wiring layer M3) and a ground wiring pattern 12 (second copper-based metal buried wiring layer M2) of FIG. 4. The details of the device structure of the LCD driver chip which is an example of the semiconductor integrated device for display drive according to the embodiment of the application will be described with reference to the drawings.

FIG. 3 (the alignment mark arrangement region 1 of FIG. 3 which is slightly magnified is shown in FIG. 4) shows cross-section X-X' of FIG. 1 (the cross-section is a schematic cross-section, and a horizontal line in an interlayer insulating film is not a boundary of the interlayer insulating film, but is a layer display indicating a wiring layer; hereinafter, the same is true of FIGS. 4, 11 to 17, 20 and 21). As shown in FIGS. 3 and 4, in this example, the surface 2a (first main surface) side (excluding regions other than a seal ring) of the chip 2 can be divided into an on-chip normal region 10 and the alignment mark arrangement region 1 (1a). The on-chip normal region 10 is a region capable of freely arranging a device pattern, under a design rule in each layer. The on-chip normal region 10 occupies, generally, most of an inside region (region within a seal ring) of the chip 2. On the other hand, the alignment mark arrangement region 1 is a region on which various restrictions are imposed with respect to some layers in order to secure the arrangement of the alignment mark 3 or the visibility thereof.

First, the on-chip normal region 10, each device layer Ld, and the like will be described in detail. As shown in FIGS. 3 and 4, for example, an actual element isolation insulating film pattern 22 (actual device pattern 6) such as an STI (Shallow Trench Isolation) insulating film 14 belonging to an STI film Ls (element isolation insulating film layer) is provided on the semiconductor region surface located on the surface 2a (first main surface) side of a chip-shaped semiconductor substrate 2s such as a P-type silicon single crystal semiconductor substrate. For example, a source drain region 16 (actual device pattern 6) is provided on the surface of an active region partitioned by the STI insulating film 14. An actual gate electrode pattern 8 (actual device pattern 6) such as a gate electrode 15 belonging to a gate polysilicon layer Lg (gate electrode layer) is provided on the surface 2a of the semiconductor substrate 2s between each of a pair of source drain regions 16, for example, with a gate insulating film interposed therebetween.

A premetal insulating film 18 (mainly, silicon oxide-based insulating film) belonging to, for example, a premetal layer Lp (tungsten plug buried layer) is provided on the surface 2a of the semiconductor substrate 2s and on the gate electrode 15, and a tungsten plug 17 (actual device pattern), for example, is buried in the premetal insulating film.

A wiring layer interlayer insulating film 25 which is mainly constituted by a silicon oxide-based insulating film or the like is provided on the premetal insulating film 18. A lower actual wiring pattern 7 (actual device pattern 6) such as a first-layer local wiring 19 belonging to the first copper-based metal buried wiring layer M1 (lower metal wiring layer) is provided in the lowermost layer of the wiring layer interlayer insulating film 25. In this example, the first-layer local wiring 19 is, for example, a copper-based metal buried wiring which is formed using a single damascene method.

In addition, for example, a second interconnection wiring (actual device pattern 6) is provided in the second copper-based metal buried wiring layer M2. In this example, the second interconnection wiring 28 is, for example, a copper-based metal buried wiring which is formed using a dual damascene method (hereinafter, the same as up to the fifth copper-based metal buried wiring layer M5).

Likewise, an intermediate actual wiring pattern 6w such as, for example, a second interconnection wiring 29 (actual device pattern 6) is provided in the third copper-based metal buried wiring layer M3 (first intermediate metal wiring layer). Further, for example, a fourth interconnection wiring 30 is provided in a fourth copper-based metal buried wiring layer (second intermediate metal wiring layer). In addition, the pad electrode 4 for bump electrode formation such as, for example, the output pad electrode 4d for bump electrode formation (pad electrode for bump electrode formation) is provided on the wiring layer interlayer insulating film 25. In this example, the pad electrode 4 for bump electrode formation is an aluminum-based pad electrode. A final passivation film 24 is provided on the wiring layer interlayer insulating film 25 and on the aluminum-based pad electrode 4. The final passivation film can include, for example, a well-known film which is constituted by, a silicon oxide-based insulating film, a silicon nitride-based insulating film, and the like. The final passivation film 24 can include, besides, an inorganic insulating film such as a silicon oxide-based insulating film and a silicon nitride-based insulating film, a monolayer film, such as an organic insulating film (for example, polyimide-based insulating film), or a composite film thereof.

A pad opening 44 is provided in the final passivation film 24 located on the aluminum-based pad electrode 4. A UBM (Under Bump Metal) film 26 is provided on the surface of the final passivation film 24 which is located within the pad opening 44 and in the vicinity thereof. Further, for example, a gold bump electrode 27 is provided on the UBM film 26.

Next, each device layer Ld of the alignment mark arrangement region 1, and the like will be described in detail. As shown in FIGS. 3 and 4, similarly to the above, for example, the actual element isolation insulating film pattern 22 (actual device pattern 6) such as the STI insulating film 14 belonging to the STI film Ls (element isolation insulating film layer) is provided on the semiconductor region surface on the surface 2a (first main surface) side of the chip-shaped semiconductor substrate 2s such as a P-type silicon single crystal semiconductor substrate. For example, the source drain region 16 (actual device pattern 6) is provided on the surface of an active region partitioned by the STI insulating film 14. The actual gate electrode pattern 8 (actual device pattern 6) such as a gate electrode 15 belonging to the gate polysilicon layer Lg (gate electrode layer) is provided on the surface 2a of the semiconductor substrate 2s between each of a pair of source drain regions 16, for example, with a gate insulating film interposed therebetween.

The premetal insulating film 18 (mainly, silicon oxide-based insulating film) belonging to, for example, the premetal layer Lp (tungsten plug buried layer) is provided on the surface 2a of the semiconductor substrate 2s and on the gate electrode 15, and the tungsten plug 17 (actual device pattern), for example, is buried in the premetal insulating film.

The wiring layer interlayer insulating film 25 which is mainly constituted by a silicon oxide-based insulating film or the like is provided on the premetal insulating film 18. The lower actual wiring pattern 7 (actual device pattern 6) such as the first-layer local wiring 19 belonging to the first copper-based metal buried wiring layer M1 (lower metal wiring layer) is provided in the lowermost layer of the wiring layer interlayer insulating film 25.

In addition, for example, the ground wiring pattern 12 (actual device pattern 6) is provided in the second copper-based metal buried wiring layer M2.

Likewise, for example, the intermediate actual wiring pattern 6w such as the power supply wiring pattern 11 (actual device pattern 6) is provided in the third copper-based metal buried wiring layer M3 (first intermediate metal wiring layer). Further, a light shielding pattern 20 (metal film having a substantially uniform thickness throughout the entire alignment mark arrangement region) which is constituted by, for example, a uniform metal film (copper-based metal film or the like in this example) is provided in the fourth copper-based metal buried wiring layer (second intermediate metal wiring layer). The light shielding pattern 20 is, of course, not essential. In case that the light shielding pattern 20 is present, there is an advantage of the visibility of an alignment pattern not being influenced due to a change in the device pattern located below the light shielding pattern.

In addition, for example, an upper dummy wiring pattern 5 is provided in the fifth copper-based metal buried wiring layer M5 (upper metal wiring layer). Further, for example, the alignment mark 3 is provided in the aluminum-based pad metal non-buried wiring layer La (pad metal wiring layer). In addition, a pad layer dummy wiring pattern 9 is provided in the aluminum-based pad metal non-buried wiring layer La around the alignment mark 3. Since the pad layer dummy wiring pattern 9 generally does not have a fine pattern, and is obtained by adding a pattern to the aluminum-based pad metal non-buried wiring layer La (pad metal wiring layer) in which relatively coarse patterns are sparsely distributed, the wiring pattern is effective (but, not essential) from the viewpoint of the utilization efficiency of the same layer.

Further, the final passivation film 24 is provided on the wiring layer interlayer insulating film 25. The final passivation film 24 can include, for example, a well-known film which is constituted by, a silicon oxide-based insulating film, a silicon nitride-based insulating film, and the like. The final passivation film 24 can include, besides, an inorganic insulating film such as a silicon oxide-based insulating film and a silicon nitride-based insulating film, a monolayer film, such as an organic insulating film (for example, polyimide-based insulating film), or a composite film thereof.

Next, FIG. 5 shows an example of the magnified upper surface layout (mainly, aluminum-based pad metal non-buried wiring layer La and fifth copper-based metal buried wiring layer M5) of the alignment mark arrangement regions 1 (1a and 1b) of FIG. 1. As shown in FIG. 5, in the aluminum-based pad metal non-buried wiring layer La (pad metal wiring layer), for example, a cruciform alignment mark 3 which is mainly constituted by an aluminum-based metal film or the like is provided at the substantially central portion of the alignment mark arrangement region 1. Likewise, in the aluminum-based pad metal non-buried wiring layer La (pad metal wiring layer), a large number of pad layer dummy wiring patterns 9 (having, for example, square shapes, rectangular shapes close thereto, or the like) finer than the alignment mark 3 are provided in a lattice shape in the alignment mark arrangement regions 1 (1a and 1b) of portions having no alignment mark 3.

In addition, in the fifth copper-based metal buried wiring layer M5 (upper metal wiring layer), for example, a large number of upper dummy wiring patterns 5 (having, for example, square shapes, rectangular shapes close thereto, or the like) finer than the alignment mark 3 are provided in a lattice shape in the substantially entire alignment mark arrangement region 1. The arrangements and shapes of the upper dummy wiring patterns 5 are not limited to those shown herein, and may be any of the arrangements and shapes with respect to whatever scatters reference light and enhances contrast.

Next, FIG. 6 shows a planar layout of the third copper-based metal buried wiring layer M3 (first intermediate metal wiring layer) and the second copper-based metal buried wiring layer M2 of FIG. 4. As shown in FIG. 6, the third copper-based metal buried wiring layer M3 (FIG. 4) constitutes, for example, the power supply wiring pattern 11 (intermediate actual wiring pattern 6w) such as a power supply trunk wiring. On the other hand, the second copper-based metal buried wiring layer M2 (FIG. 4) constitutes a ground wiring pattern.

3. Description of Modification Example of Light Shielding Pattern In Device Structure of LCD Driver Chip Which is an Example of Semiconductor Integrated Device for Display Drive According to Embodiment of the Application (See Mainly FIGS. 7 and 8)

In this section, a description will be given of a modification example (line-and-space uniform shielding film with a slit) of the light shielding pattern (example of FIG. 4, that is, the entire uniform shielding film) that shields reference light (for example, broadband visible light) for observing the alignment mark 3 to avoid an influence on the observation of a lower actual device pattern. In the following example, the light shielding pattern is mainly described, but can be regarded as a dummy pattern for reference light diffusion similarly to the upper dummy wiring pattern 5 of FIG. 5. In addition, a uniform shielding film with a slit can also be used as a power supply wiring or the like similarly to FIG. 6.

Figure 7:
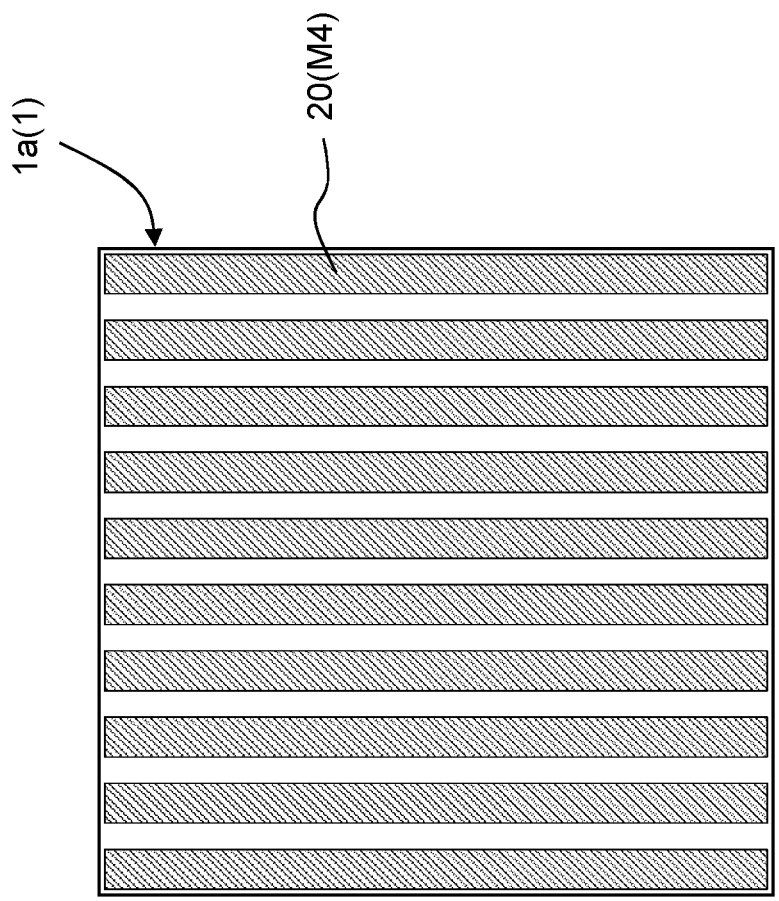
FIG. 7 is a planar layout diagram of FIG. 4 (showing a light shielding pattern 20 constituted by a second intermediate metal wiring layer, that is, a fourth copper-based metal buried wiring layer M4) illustrating Modification Example 1 of a light shielding pattern (line-and-space light shielding pattern) in the device structure of the LCD driver chip which is an example of the semiconductor integrated device for display drive according to the embodiment of the application.
Figure 8:
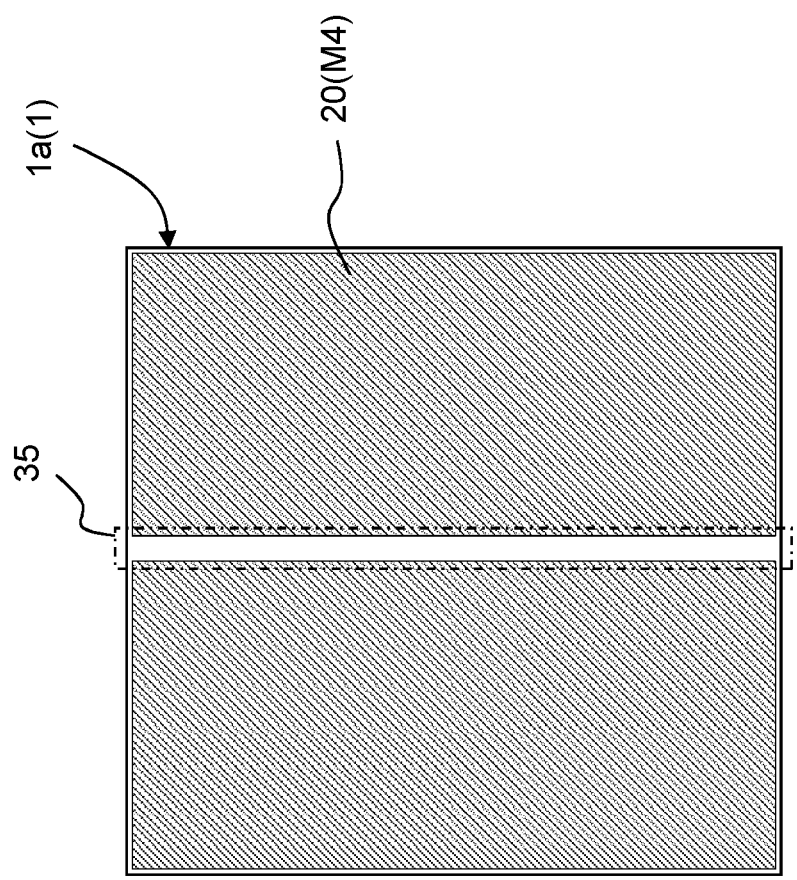
FIG. 8 is a planar layout diagram of FIG. 4 (showing the light shielding pattern 20 constituted by the second intermediate metal wiring layer, that is, the fourth copper-based metal buried wiring layer M4) illustrating Modification Example 2 of a light shielding pattern (planar light shielding pattern with a slit) in the device structure of the LCD driver chip which is an example of the semiconductor integrated device for display drive according to the embodiment of the application.

FIG. 7 is a planar layout diagram of FIG. 4 (showing the light shielding pattern 20 constituted by the second intermediate metal wiring layer, that is, the fourth copper-based metal buried wiring layer M4) illustrating Modification Example 1 of the light shielding pattern (line-and-space light shielding pattern) in the device structure of the LCD driver chip which is an example of the semiconductor integrated device for display drive according to the embodiment of the application. FIG. 8 is a planar layout diagram of FIG. 4 (showing the light shielding pattern 20 constituted by the second intermediate metal wiring layer, that is, the fourth copper-based metal buried wiring layer M4) illustrating Modification Example 2 of a light shielding pattern (planar light shielding pattern with a slit) in the device structure of the LCD driver chip which is an example of the semiconductor integrated device for display drive according to the embodiment of the application. The modification example of the light shielding pattern in the device structure of the LCD driver chip which is an example of the semiconductor integrated device for display drive according to the embodiment of the application will be described with reference to the drawings.

(1) Line-and-Space Light Shielding Pattern (See Mainly FIG. 7)

In this example, as shown in FIG. 7, the light shielding pattern 20 (which is constituted by, for example, the fourth copper-based metal buried wiring layer M4, that is, the second intermediate metal wiring layer) constituted by a line-and-space pattern having fine dimensions due to lithography is substituted for the light shielding pattern 20 having a uniform thickness in FIG. 4 (which is constituted by, for example, the fourth copper-based metal buried wiring layer M4).

In this example, as compared to the light shielding pattern 20 (FIG. 4) having a uniform thickness as shown in FIG. 4, that is, the planar light shielding pattern having a uniform thickness, a shielding ratio lowers, but there is an advantage that a pattern occupancy ratio (ratio of a pattern portion to the chip area in the vicinity of the corresponding portion) is not so high (differs little from that of the on-chip normal region 10 in FIG. 3).

In addition, there is an advantage that the compatibility of a damascene process or the like with a buried wiring process is satisfactory due to the periodic repetition of the line and space having fine dimensions, and the like (there is the same effect with respect to etching even in a non-buried wiring). In particular, since a CMP process in the damascene process is adverse to a wide wiring, a process advantage is particularly great in a case of a buried wiring.

Meanwhile, the line-and-space pattern is not required to be constituted by a straight line, but has an advantage in lithography in case that the pattern is constituted by a straight line.

(2) Planar Light Shielding Pattern with Slit (See Mainly FIG. 8)

In this example, as shown in FIG. 8, in order to avoid various problems associated with a relatively wide metal pattern, the planar light shielding pattern is midway provided with at least one (which may be, for example, two or more) slit 35 or a separator (a linear separator may be constituted by a partial slit even when cut longitudinal, or an aggregate of a plurality of slits). The planar light shielding pattern with a slit 20 is constituted by, for example, the fourth copper-based metal buried wiring layer M4 similarly to the above.

4. Description of Modification Example Relating to Actual Device Pattern Within Alignment Mark Arrangement Region (See Mainly FIGS. 9 and 10)

In the examples of sections 1 to 3, examples are shown in which the lower device layer is used as a power supply wiring arrangement region or the like within the alignment mark arrangement region, whereas in this section, an example is described in which the device layer is uses as an ESD (Electrostatic Discharge) protection element arrangement region.

Figure 9:
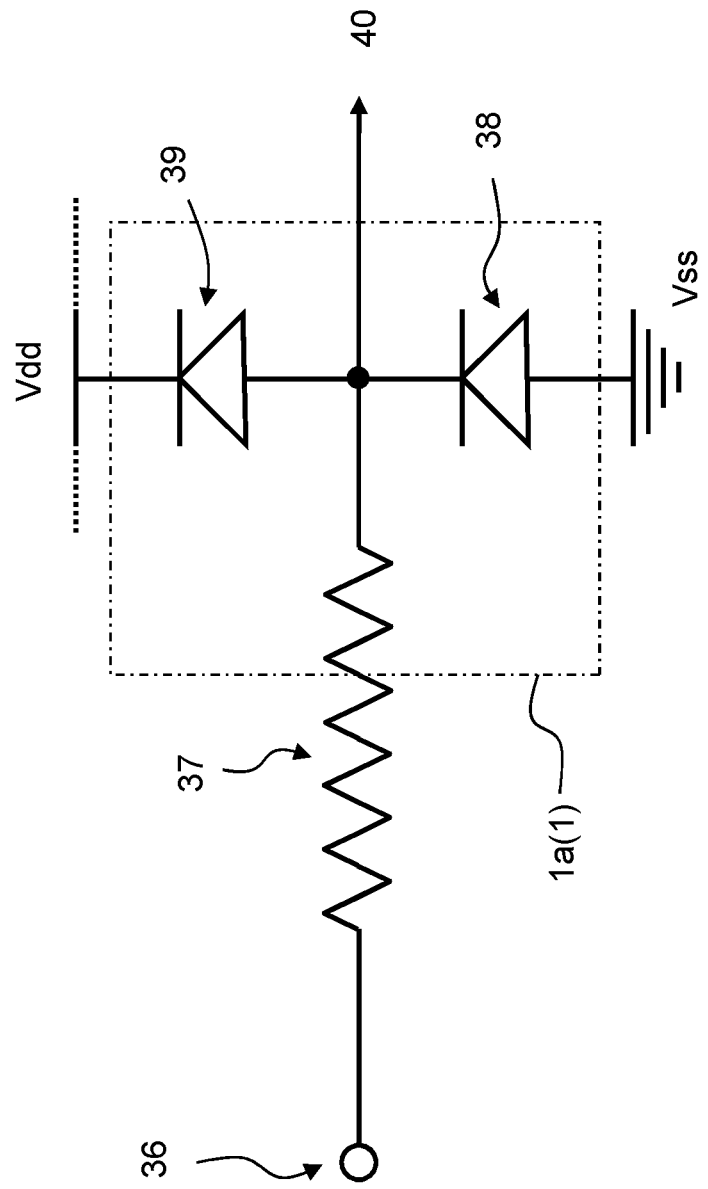
FIG. 9 is a circuit diagram of an input protection circuit illustrating a modification example relating to an actual device pattern within the alignment mark arrangement region.
Figure 10:
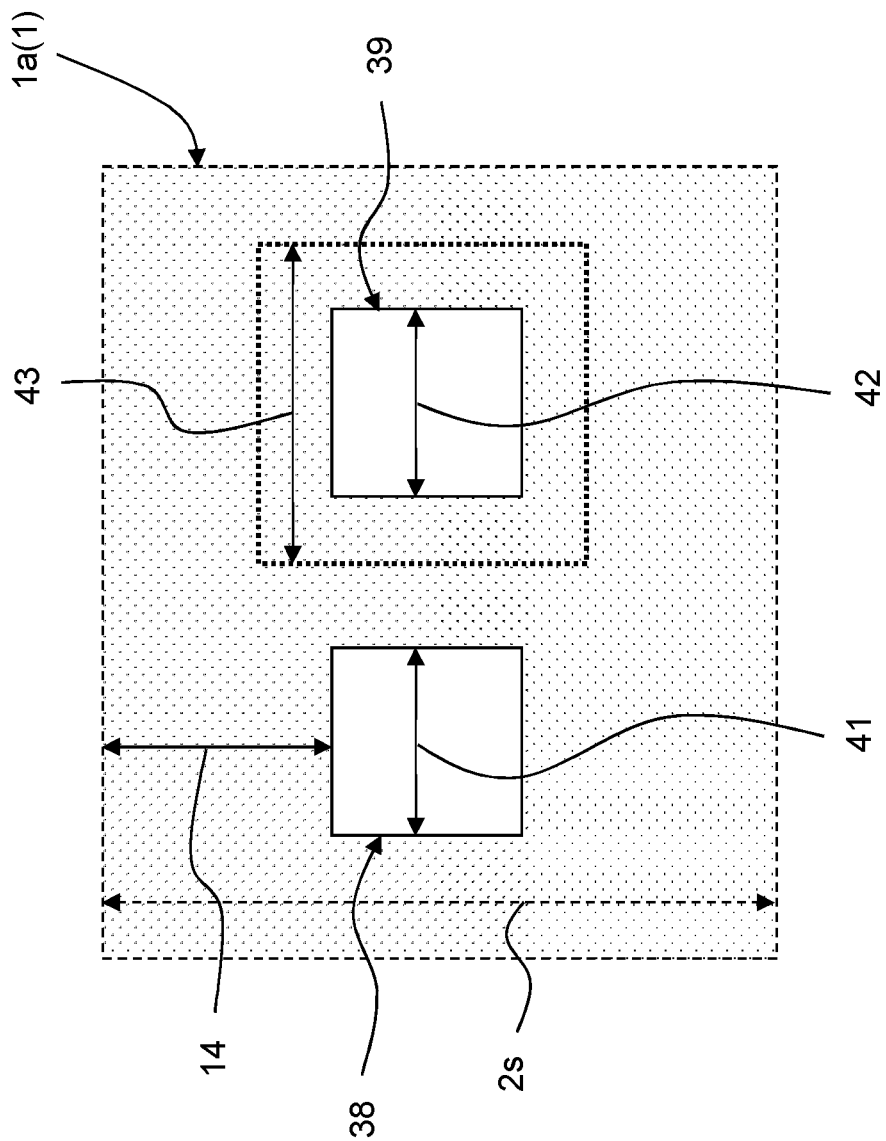
FIG. 10 is a schematic top view illustrating a semiconductor substrate corresponding to portions of diodes 38 and 39 of FIG. 9.

FIG. 9 is a circuit diagram of an input protection circuit illustrating a modification example relating to an actual device pattern within the alignment mark arrangement region. FIG. 10 is a schematic top view illustrating a semiconductor substrate corresponding to portions of diodes 38 and 39 of FIG. 9. A modification example relating to the actual device pattern within the alignment mark arrangement region will be described with reference to the drawings.

As shown in FIG. 9, the input protection circuit is constituted by, for example, a protective resistor 37 (for example, polysilicon resistor, diffused resistor or the like) of which one end is connected to an input terminal 36, and input protection elements such as a protection diode 39 (protection diode connected to N-type wells) and a protection diode 38 (protection diode connected to substrates) which are connected to the other end of the protective resistor 37 between a power supply potential Vdd and a ground potential Vss. An internal circuit 40 is present at the inner side of the input protection circuit, and a gate electrode or the like of a MISFET (Metal Insulator Semiconductor Field Effect Transistor), for example, to be protected is connected thereto.

In this example, in addition to the power supply wiring pattern 11, the ground wiring pattern 12 and the like of FIG. 6, or instead thereof, all or some of the input protection elements are arranged using a layer within the alignment mark arrangement regions 1 (1a and 1b) which are capable of freely constituting a device. The input protection elements and the alignment mark arrangement regions 1 (1a and 1b) serve, by their nature, as the peripheral portions of a chip in many cases, and such ways of use are of particular value.

FIG. 10 illustratively shows a portion of an example of the protection elements which are formed in the alignment mark arrangement regions 1 (1a and 1b) of FIG. 9. As shown in FIG. 10, for example, active regions for the protection diode 38 connected to substrates and for the protection diode 39 connected to N-type wells are opened in the STI insulating film 14 (for example, a P-type substrate region 2s is located thereunder). An N-type well region 43 is formed throughout the active region for the protection diode 39 connected to N-type wells, and the surface of the P-type substrate region 2s in the vicinity thereof. An N+ region 41 (cathode region of the protection diode connected to substrates) is formed on the surface of the P-type substrate region 2s corresponding to the active region for the protection diode 38 connected to substrates. On the other hand, a P+ region 42 (protection diode anode region connected to N-type wells) is formed on the surface of the N-type well region 43 corresponding to the active region for the protection diode 39 connected to N-type wells.

5. Description of Various Modification Examples Relating to the Entire Device Structure Within Alignment Mark Arrangement Region (Identification Pattern Arrangement Region) (See Mainly FIGS. 11 to 20)

The respective elements of FIG. 4 and the like as described so far are all indispensable, and the respective elements can be extracted and be freely combined. Hereinafter, regarding the combination thereof and their further improvements, examples of the combination thereof are shown. The combination thereof is illustrative, and components of each combination are not all indispensable.

Figure 11:
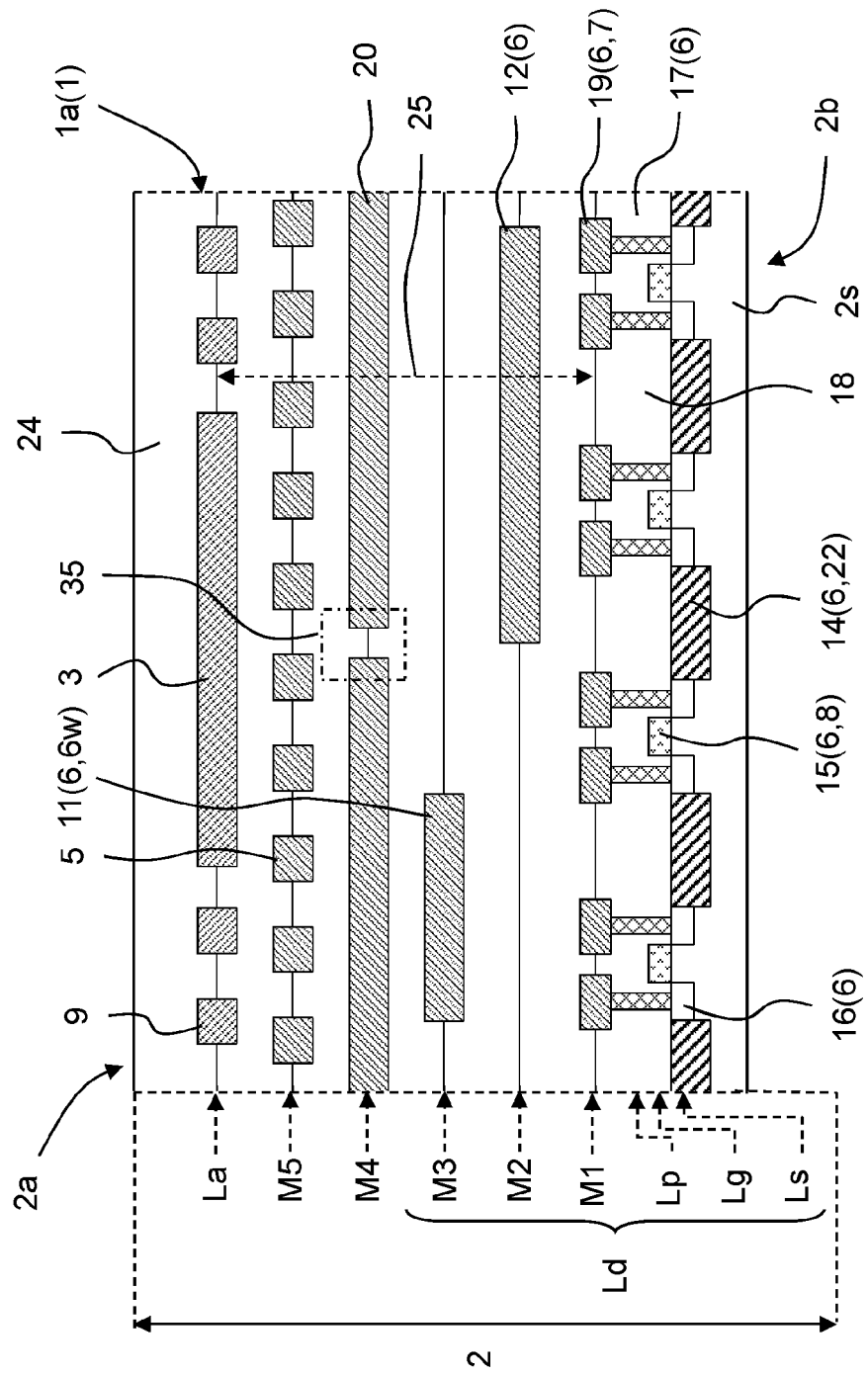
FIG. 11 is an enlarged cross-sectional view of the alignment mark arrangement region 1a (1) corresponding to FIG. 4 illustrating Modification Example 1 (introduction of a slit into a light shielding pattern) relating to the entire device structure within the alignment mark arrangement region.
Figure 12:
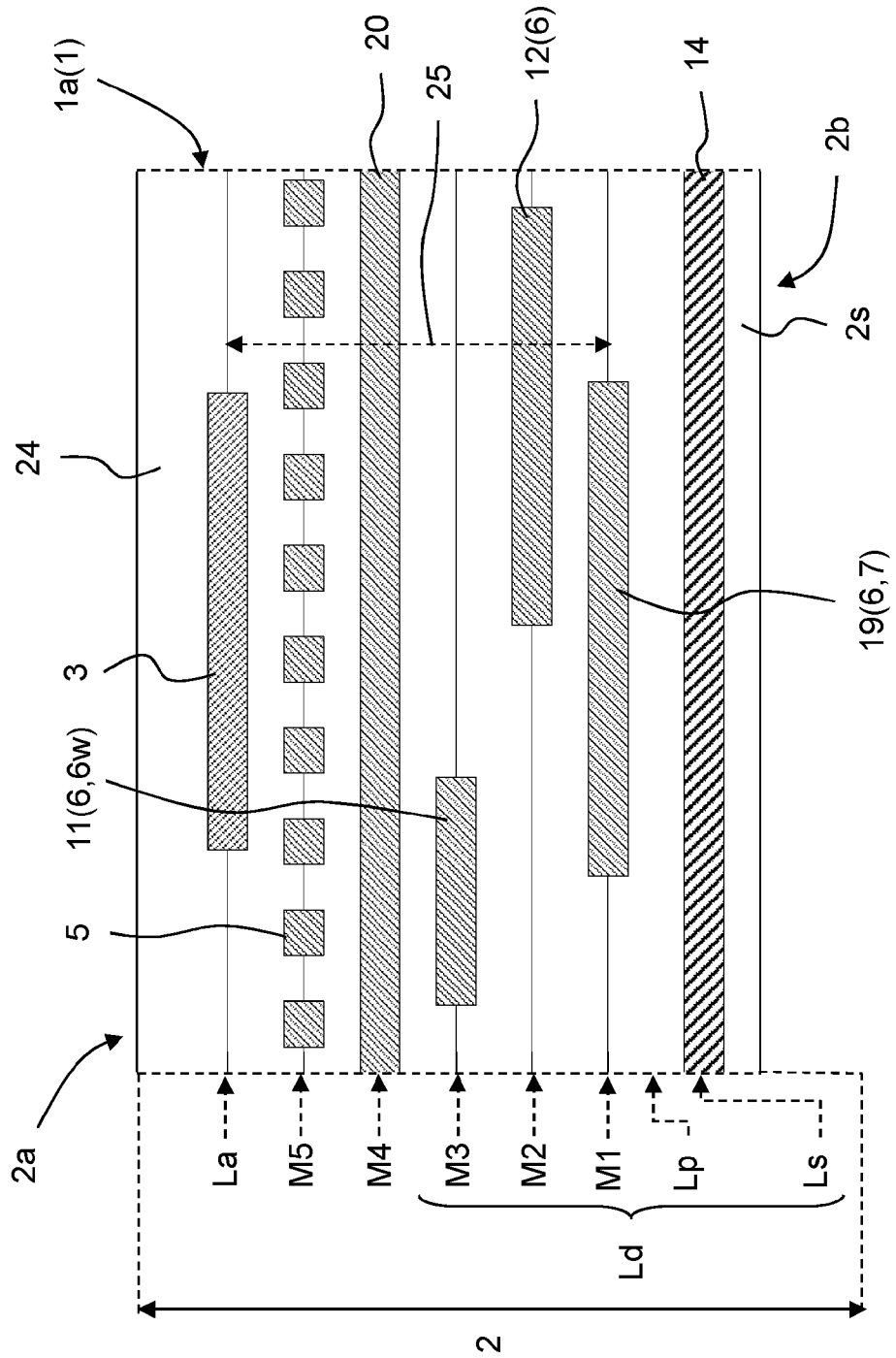
FIG. 12 is an enlarged cross-sectional view of the alignment mark arrangement region 1a (1) corresponding to FIG. 4 illustrating Modification Example 2 (omission of a pad layer dummy wiring pattern and introduction of a flat STI) relating to the entire device structure within the alignment mark arrangement region.
Figure 13:
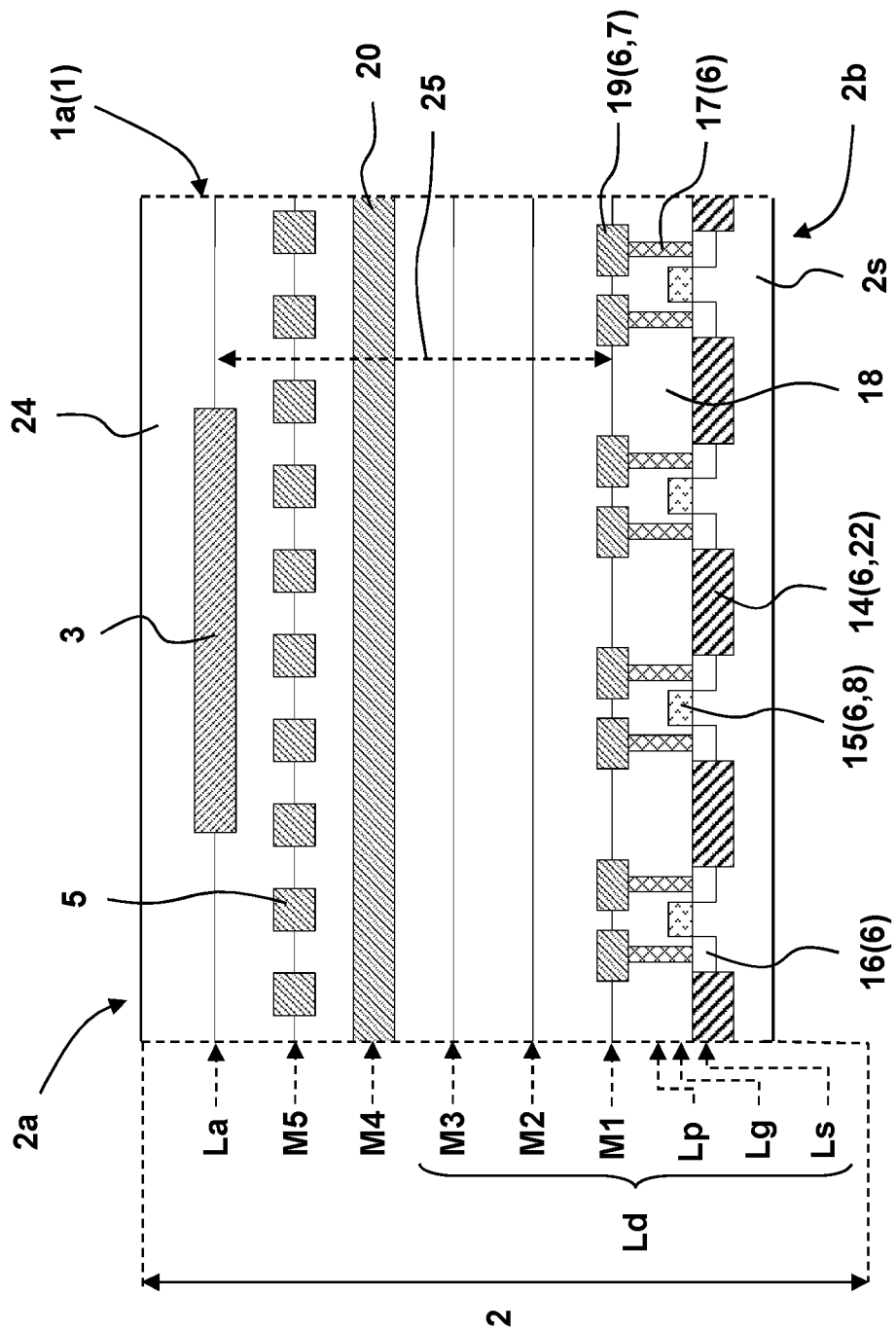
FIG. 13 is an enlarged cross-sectional view of the alignment mark arrangement region 1a (1) corresponding to FIG.

FIG. 11 is an enlarged cross-sectional view of the alignment mark arrangement region 1a (1) corresponding to FIG. 4 illustrating Modification Example 1 (introduction of a slit into a light shielding pattern) relating to the entire device structure within the alignment mark arrangement region. FIG. 12 is an enlarged cross-sectional view of the alignment mark arrangement region 1a (1) corresponding to FIG. 4 illustrating Modification Example 2 (omission of a pad layer dummy wiring pattern and introduction of a flat STI) relating to the entire device structure within the alignment mark arrangement region. FIG. 13 is an enlarged cross-sectional view of the alignment mark arrangement region 1a (1) corresponding to FIG. 4 illustrating Modification Example 3 (omission of the pad layer dummy wiring pattern and a lower actual wiring pattern) relating to the entire device structure within the alignment mark arrangement region. FIG. 14 is an enlarged cross-sectional view of the alignment mark arrangement region 1a (1) corresponding to FIG. 4 illustrating Modification Example 4 (omission of the pad layer dummy wiring pattern and introduction of an upper two-layer dummy pattern) relating to the entire device structure within the alignment mark arrangement region. FIG. 15 is an enlarged cross-sectional view of the alignment mark arrangement region 1a (1) corresponding to FIG. 4 illustrating Modification Example 5 (omission of the pad layer dummy wiring pattern and the lower actual wiring pattern and introduction of the upper two-layer dummy pattern) relating to the entire device structure within the alignment mark arrangement region. FIG. 16 is an enlarged cross-sectional view of the alignment mark arrangement region 1a (1) corresponding to FIG. 4 illustrating Modification Example 6 (omission of the pad layer dummy wiring pattern and the light shielding pattern, and introduction of the upper two-layer dummy pattern and the flat STI) relating to the entire device structure within the alignment mark arrangement region. FIG. 17 is an enlarged cross-sectional view of the alignment mark arrangement region 1a (1) corresponding to FIG. 4 illustrating Modification Example 7 (omission of the pad layer dummy wiring pattern and the light shielding pattern, and introduction of the upper two-layer dummy pattern) relating to the entire device structure within the alignment mark arrangement region. FIG. 18 is a layout diagram of the entire chip surface corresponding to FIG. 1 illustrating Modification Example 8 relating to the entire device structure within an identification pattern arrangement region. FIG. 19 is a top view (mainly showing the pad metal wiring layer La and the upper metal wiring layer M5) of an identification pattern arrangement region 21 of FIG. 18. FIG. 20 is an enlarged cross-sectional view of the identification pattern arrangement region 21 of cross-section B-B' of FIG. 18 corresponding to FIG. 4. Various modification examples relating to the entire device structure within the alignment mark arrangement region (identification pattern arrangement region) will be described with reference to the drawings.

(1) Introduction of Slit into Light Shielding Pattern in FIG. 4 (See Mainly FIG. 8 Using FIG. 11)

In this example, as shown in FIG. 11, the slit 35 is introduced into the light shielding pattern 20 in FIG. 4. In this manner, similarly to FIGS. 4 and 7, even in case that the lower layer, that is, the third copper-based metal buried wiring layer M3 (first intermediate metal wiring layer), or the device layer located below this layer changes, it is possible to sufficiently reduce an undesired change in alignment image due to the above change. In addition, the slit or the like is present, and thus it is possible to obtain the same effect as described in subsection (2) of section 3.

(2) Omission of Pad Layer Dummy Wiring Pattern in FIG. 4 and Introduction of STI (See Mainly FIG. 12)

As shown in FIG. 12, this example has the following feature as compared to FIG. 4.

(a) The pad layer dummy wiring pattern 9 of FIG. 4 is omitted.

(b) The first copper-based metal buried wiring layer M1 (lower metal wiring layer) is used as the first local wiring 19 (actual device pattern 6, that is, intermediate actual wiring pattern 6w) having no direct relation to the lower tungsten plug buried layer Lp or the STI film Ls (element isolation insulating film layer).

(c) A special pattern is not formed in the device layer located below the first copper-based metal buried wiring layer M1 (lower metal wiring layer), that is, the tungsten plug buried layer Lp and the element isolation insulating film layer Ls. Specifically, the patterns of the gate polysilicon layer Lg (gate electrode layer) and the tungsten plug buried layer Lp are not present, and the element isolation insulating film layer Ls includes only the STI film (silicon oxide-based field insulating film) having a uniform thickness on the entire surface thereof.

As described in the above (a) of this subsection, in case that the pad layer dummy wiring pattern 9 is omitted, a fine pattern is not included in the aluminum-based pad metal non-buried wiring layer La (pad metal wiring layer), and thus there is an advantage that a relatively rough lithography process can be applied.

Further, as described in the above (b) and (c) of this subsection, in case that a structure is used in which an FET or the like is not formed, there is an advantage that the first copper-based metal buried wiring layer M1 (lower metal wiring layer) can be used as other interconnection wirings, power supply wirings, and ground wirings which have no direct relation to the FET or the like.

(3) Omission of Pad Layer Dummy Wiring Pattern and Lower Actual Wiring Pattern in FIG. 4 (See Mainly FIG. 13)

As shown in FIG. 13, this example has the following feature as compared to FIG. 12.

(a) The second copper-based metal buried wiring layer M2 and the third copper-based metal buried wiring layer M3 (first intermediate metal wiring layer) are not used in the power supply wiring pattern 11, the ground wiring pattern 12, and the like. Therefore, these layers can be used as other interconnection wirings.

(b) The device layer located below the first copper-based metal buried wiring layer M1 (lower metal wiring layer) has an actual device such as the FET formed therein similarly to FIG. 4.

In this manner, since the second copper-based metal buried wiring layer M2 and the third copper-based metal buried wiring layer M3 (first intermediate metal wiring layer) are not used in the power supply wiring pattern 11, the ground wiring pattern 12, and the like, there is an advantage that the layout of the interconnection wiring associated with the actual device such as the FET of the device layer located below the first copper-based metal buried wiring layer M1 (lower metal wiring layer) is facilitated.

(4) Omission of Pad Layer Dummy Wiring Pattern in FIG. 4 and Introduction of Upper Two-Layer Dummy Pattern (See Mainly FIG. 14)

As shown in FIG. 14, this example has the following feature as compared to FIG. 12.

(a) The upper dummy wiring pattern 5 of FIG. 12 (FIG. 4) is formed throughout two layers of the fourth copper-based metal buried wiring layer M4 (second intermediate metal wiring layer) and the fifth copper-based metal buried wiring layer M5 (upper metal wiring layer).

(b) As a result, the light shielding pattern 20 of FIG. 12 (FIG. 4) is constituted by the third copper-based metal buried wiring layer M3 (first intermediate metal wiring layer).

(c) Further, as a result, the power supply wiring pattern 11 and the ground wiring pattern 12 of FIG. 12 (FIG. 4), respectively, descend by one layer. Thus, the power supply wiring pattern 11 is constituted by the second copper-based metal buried wiring layer M2, and the ground wiring pattern 12 is constituted by the first copper-based metal buried wiring layer M1 (lower metal wiring layer).

As described in the above (a) of this subsection, upper dummy wiring patterns 5a and 5b are formed throughout, for example, two layers (a plurality of layers) of the fourth copper-based metal buried wiring layer M4 (second intermediate metal wiring layer) and the fifth copper-based metal buried wiring layer M5 (upper metal wiring layer), and thus there is an advantage that the contrast of an alignment image can be sufficiently secured.

On the other hand, generally, as a current supply wiring or a ground wiring, a higher-layer wiring having a large current capacity is advantageous (example of FIG. 4, 12 or the like). However, as described in the above (c) of this subsection, there is an advantage that the current supply wiring or the ground wiring can be freely formed using the first copper-based metal buried wiring layer M1 (lower metal wiring layer), the second copper-based metal buried wiring layer M2, and the like.

(5) Omission of Pad Layer Dummy Wiring Pattern and Lower Actual Wiring Pattern in FIG. 4 and Introduction of Upper Two-Layer Dummy Pattern (See Mainly FIG. 15)

As shown in FIG. 15, this example has the following feature as compared to FIG. 14.

(a) The second copper-based metal buried wiring layer M2 is not used in the power supply wiring pattern 11, the ground wiring pattern 12, and the like. Therefore, the layer can be used as other interconnection wirings.

(b) The device layer located below the first copper-based metal buried wiring layer M1 (lower metal wiring layer) has an actual device such as the FET formed therein similarly to FIG. 4.

In this manner, since the second copper-based metal buried wiring layer M2 is not used in the power supply wiring pattern 11, the ground wiring pattern 12, and the like, there is an advantage that the layout of the interconnection wiring associated with the actual device such as the FET of the device layer located below the first copper-based metal buried wiring layer M1 (lower metal wiring layer) is facilitated.

(6) Omission of Pad Layer Dummy Wiring Pattern and Light Shielding Pattern in FIG. 4 and Introduction of Upper Two-Layer Dummy Pattern and STI (See Mainly FIG. 16)

As shown in FIG. 16, this example has the following feature as compared to FIG. 14.

The light shielding pattern 20 of FIG. 14 is omitted. This is because, since the upper dummy wiring pattern 5 is formed throughout two layers of the fourth copper-based metal buried wiring layer M4 (second intermediate metal wiring layer) and the fifth copper-based metal buried wiring layer M5 (upper metal wiring layer), a shielding effect is also achieved to a considerable extent.

In this manner, there is an advantage that the first copper-based metal buried wiring layer M1 (lower metal wiring layer), the second copper-based metal buried wiring layer M2, and the third copper-based metal buried wiring layer M3 (first intermediate metal wiring layer) can be freely used in the power supply wiring, the ground wiring, and other interconnection wirings.

(7) Omission of Pad Layer Dummy Wiring Pattern and Light Shielding Pattern in FIG. 4 and Introduction of Upper Two-Layer Dummy Pattern (See Mainly FIG. 17)

As shown in FIG. 17, this example has the following feature as compared to FIG. 16.

(a) The second copper-based metal buried wiring layer M2 and the third copper-based metal buried wiring layer M3 (first intermediate metal wiring layer) is not used in the power supply wiring pattern 11, the ground wiring pattern 12, and the like. Therefore, these layers can be used as other interconnection wirings.

(b) The device layer located below the first copper-based metal buried wiring layer M1 (lower metal wiring layer) has an actual device such as the FET formed therein similarly to FIG. 4.

In this manner, since the second copper-based metal buried wiring layer M2 and the third copper-based metal buried wiring layer M3 (first intermediate metal wiring layer) are not used in the power supply wiring pattern 11, the ground wiring pattern 12, and the like, there is an advantage that the layout of the interconnection wiring associated with the actual device such as the FET of the device layer located below the first copper-based metal buried wiring layer M1 (lower metal wiring layer) is facilitated.

(8) Example in which the Above-Mentioned Embodiment (Including Modification Example) is Also Applied to Identification Pattern Arrangement Region Independently of Alignment Mark Arrangement Region or in Addition Thereto (See Mainly FIGS. 18 to 20)

In this example, the point of view of the layout (including each embodiment and modification example) of the alignment mark arrangement regions 1 (1a and 1b) as described so far is applied to both the alignment mark arrangement region 1 (1a, 1b) and the identification pattern arrangement region 21, or only to the identification pattern arrangement region 21. Therefore, FIGS. 18, 19 and 20 correspond to FIGS. 1, 5 and 4, respectively, and the contents are basically the same as each other. Hereinafter, only different portions will be described in principle. In addition, because of repetition, regarding the cross-sectional configuration, only one example (example corresponding most closely to FIG. 4) will be described in detail.

As shown in FIG. 18, the identification pattern arrangement region 21 on which so-called identification patterns (identification characters, signs, patterns, or combinations thereof) such as process information of a product model name, a company's name, a lot number, and the like are generally displayed is provided on the surface 2a (first main surface) of the chip 2, in addition to the alignment mark arrangement regions 1 (1a and 1b).

FIG. 19 shows an enlarged plan view of the identification pattern arrangement region 21 in FIG. 18. However, similarly to FIG. 4, only the aluminum-based pad metal non-buried wiring layer La (pad metal wiring layer) and the fifth copper-based metal buried wiring layer M5 (upper metal wiring layer) are mainly displayed. In addition, as compared to FIG. 4, the reason for the pad layer dummy wiring pattern 9 not being provided is that since elements constituting the identification pattern are relatively small, there is a concern of the visibility of an image being deteriorated in case that the identification pattern is automatically recognized, or the like.

Next, FIG. 20 shows cross-section B-B' in FIGS. 18 and 19. As shown in FIGS. 19 and 20, an identification pattern 23 is provided in the aluminum-based pad metal non-buried wiring layer La (pad metal wiring layer) within the identification pattern arrangement region 21, and the upper dummy wiring pattern 5 is provided, for example, in a matrix in the fifth copper-based metal buried wiring layer M5 (upper metal wiring layer), similarly to FIG. 4.

In this manner, as previously described with respect to the alignment mark arrangement regions 1 (1a and 1b), the area of each layer within the chip can be effectively utilized, and as a result, the arrangement of circuit modules and the like is facilitated.

6. Supplementary Description and General Review Relating to the Embodiment (Including Modification Example) (See Mainly FIG. 21)

FIG. 21 is a schematic cross-sectional view of a chip corresponding to cross-section X-X' of FIG. 1 corresponding to FIG. 3 illustrating the outline of the device structure of the LCD driver chip which is an example of the semiconductor integrated device for display drive according to the embodiment of the application. A supplementary description and a general review relating to the embodiment (including the modification example) are performed with respect to the drawing.

As previously described, in order to secure the visibility of the alignment mark of the semiconductor integrated device for display drive such as the LCD driver chip, generally, the alignment mark arrangement region in which the alignment mark is arranged is not provided with an actual pattern, but is instead provided with a dummy pattern.

However, the inventor has found as a result of examining these methods that in such methods, there is a concern that the flexibility at the time of performing the layout of a circuit module or the like on the driver chip may be significantly reduced.

Consequently, the description of the outline of the embodiment (including the modification example) is as follows. That is, as shown in FIG. 21, the semiconductor integrated device for display drive such as the LCD driver chip is formed mainly on the surface 2a (first main surface) side of the chip-shaped semiconductor substrate 2s (2). The semiconductor integrated device includes a large number of pad electrodes 4 for bump electrode formation which are constituted by the pad metal wiring layer La. The alignment mark arrangement region 1 is provided on the first main surface 2a side of the chip-shaped semiconductor substrate 2s. The alignment mark 3 constituted by the pad metal wiring layer La is provided within the alignment mark arrangement region 1. Further, the upper dummy wiring pattern 5 constituted by the upper metal wiring layer M5 (which is not necessarily the fifth wiring layer) located below the pad metal wiring layer La is provided within the alignment mark arrangement region 1. Further, the actual device pattern 6 constituted by the device layer Ld (wiring layer, plug layer, gate electrode layer, insulating film layer, or the like) located below the upper metal wiring layer M5 is provided within the alignment mark arrangement region 1.

With such a configuration, it is possible to improve the degree of freedom of the layout of circuit modules and the like.

7. Summary

As stated above, while the invention devised by the inventor has been described specifically based on the embodiments thereof, the present invention is not limited to the above-mentioned embodiments, and it goes without saying that various changes and modifications may be made without departing from the scope of the invention.

For example, in the above embodiments, a detailed description has been given by taking an example of the device constituted by the wiring layer configurations of five layers of copper-based buried wirings and one layer of aluminum-based non-buried wiring (uppermost layer), but it goes without saying that a device constituted by other wiring layer configurations may be used. For example, the total number of wiring layers may be any of approximately 3 to 20. In addition, the aluminum-based non-buried wiring (tungsten-based non-buried wiring or buried wiring in a case of some layers) may be used instead of the copper-based buried wiring. In addition, there may be a case to the contrary. The uppermost-layer aluminum-based non-buried wiring may be replaced by the copper-based buried wiring. Further, the buried wiring may be silver and others without being limited to copper.

In addition, in the above embodiments, as an object to be driven, a detailed description has been given by taking an example of the LCD, but it goes without saying that other displays may be used.

What is claimed is:

1. A semiconductor integrated device for display drive comprising:
   (a) a chip-shaped semiconductor substrate having a first main surface;
   (b) a large number of pad electrodes for bump electrode formation, provided on the first main surface side of the chip-shaped semiconductor substrate, which are constituted by a pad metal wiring layer;
   (c) an alignment mark arrangement region provided on the first main surface side of the chip-shaped semiconductor substrate;
   (d) an alignment mark, provided on the first main surface side of the chip-shaped semiconductor substrate and within the alignment mark arrangement region, which is constituted by the pad metal wiring layer;
   (e) an upper dummy wiring pattern, provided on the first main surface side of the chip-shaped semiconductor substrate and within the alignment mark arrangement region, which is constituted by an upper metal wiring layer located below the pad metal wiring layer; and
   (f) an actual device pattern, provided on the first main surface side of the chip-shaped semiconductor substrate and within the alignment mark arrangement region, which is constituted by a lower device layer located below the upper metal wiring layer,
   wherein the lower device layer comprises an element pattern contributing to a circuit configuration of the device.

2. The semiconductor integrated device for display drive according to claim 1, wherein the lower device layer is a first intermediate metal wiring layer, and the actual device pattern is an intermediate actual wiring pattern.

3. The semiconductor integrated device for display drive according to claim 2, further comprising:
   (g) a lower actual wiring pattern, provided on the first main surface side of the chip-shaped semiconductor substrate and within the alignment mark arrangement region, which is constituted by a lower metal wiring layer located below the first intermediate metal wiring layer.

4. The semiconductor integrated device for display drive according to claim 3, further comprising:
   (h) a light shielding pattern, provided on the first main surface side of the chip-shaped semiconductor substrate and within the alignment mark arrangement region, which is constituted by a second intermediate metal wiring layer located below the upper metal wiring layer and located above the first intermediate metal wiring layer.

5. The semiconductor integrated device for display drive according to claim 4, wherein the light shielding pattern is a line-and-space pattern.

6. The semiconductor integrated device for display drive according to claim 5, wherein the intermediate actual wiring pattern is a power supply wiring pattern.

7. The semiconductor integrated device for display drive according to claim 6, wherein the upper metal wiring layer, the first intermediate metal wiring layer, the second intermediate metal wiring layer and the lower metal wiring layer are copper-based buried wirings, respectively.

8. The semiconductor integrated device for display drive according to claim 7, wherein the pad metal wiring layer is an aluminum-based non-buried wiring.

9. The semiconductor integrated device for display drive according to claim 8, further comprising:
   (i) a pad layer dummy wiring pattern, provided on the first main surface side of the chip-shaped semiconductor substrate and in the vicinity of the alignment mark within the alignment mark arrangement region, which is constituted by the pad metal wiring layer.

10. The semiconductor integrated device for display drive according to claim 9, further comprising:
    (j) an actual gate electrode pattern, provided on the first main surface side of the chip-shaped semiconductor substrate and within the alignment mark arrangement region, which is constituted by a gate electrode layer located below the lower metal wiring layer; and
    (k) an actual element isolation insulating film pattern, provided on the first main surface side of the chip-shaped semiconductor substrate and within the alignment mark arrangement region, which is constituted by an element isolation insulating film layer located below the gate electrode layer.

11. A semiconductor integrated device for display drive comprising:
    (a) a chip-shaped semiconductor substrate having a first main surface;
    (b) a large number of pad electrodes for bump electrode formation, provided on the first main surface side of the chip-shaped semiconductor substrate, which are constituted by a pad metal wiring layer;
    (c) an identification pattern arrangement region provided on the first main surface side of the chip-shaped semiconductor substrate;
    (d) an identification pattern, provided on the first main surface side of the chip-shaped semiconductor substrate and within the identification pattern arrangement region, which is constituted by the pad metal wiring layer;
    (e) an upper dummy wiring pattern, provided on the first main surface side of the chip-shaped semiconductor substrate and within the identification pattern arrangement region, which is constituted by an upper metal wiring layer located below the pad metal wiring layer; and
    (f) an actual device pattern, provided on the first main surface side of the chip-shaped semiconductor substrate and within the identification pattern arrangement region, which is constituted by a lower device layer located below the upper metal wiring layer,
    wherein the lower device layer comprises an element pattern contributing to a circuit configuration of the device.

12. The semiconductor integrated device for display drive according to claim 11, wherein the lower device layer is a first intermediate metal wiring layer, and the actual device pattern is an intermediate actual wiring pattern.

13. The semiconductor integrated device for display drive according to claim 12, further comprising:
    (g) a lower actual wiring pattern, provided on the first main surface side of the chip-shaped semiconductor substrate and within the identification pattern arrangement region, which is constituted by a lower metal wiring layer located below the first intermediate metal wiring layer.

14. The semiconductor integrated device for display drive according to claim 13, further comprising:
    (h) alight shielding pattern, provided on the first main surface side of the chip-shaped semiconductor substrate and within the identification pattern arrangement region, which is constituted by a second intermediate metal wiring layer located below the upper metal wiring layer and located above the first intermediate metal wiring layer.

15. The semiconductor integrated device for display drive according to claim 14, wherein the light shielding pattern is a line-and-space pattern.

16. The semiconductor integrated device for display drive according to claim 15, wherein the intermediate actual wiring pattern is a power supply wiring pattern.

17. The semiconductor integrated device for display drive according to claim 16, wherein the upper metal wiring layer, the first intermediate metal wiring layer, the second intermediate metal wiring layer and the lower metal wiring layer are copper-based buried wirings, respectively.

18. The semiconductor integrated device for display drive according to claim 17, wherein the pad metal wiring layer is an aluminum-based non-buried wiring.

19. The semiconductor integrated device for display drive according to claim 18, further comprising:
    (i) a pad layer dummy wiring pattern, provided on the first main surface side of the chip-shaped semiconductor substrate and in the vicinity of the identification pattern within the identification pattern arrangement region, which is constituted by the pad metal wiring layer.

20. The semiconductor integrated device for display drive according to claim 19, further comprising:
    (j) an actual gate electrode pattern, provided on the first main surface side of the chip-shaped semiconductor substrate and within the identification pattern arrangement region, which is constituted by a gate electrode layer located below the lower metal wiring layer; and
    (k) an actual element isolation insulating film pattern, provided on the first main surface side of the chip-shaped semiconductor substrate and within the identification pattern arrangement region, which is constituted by an element isolation insulating film layer located below the gate electrode layer.

* * * * *